United States Patent
An

(10) Patent No.: US 8,264,262 B2
(45) Date of Patent: Sep. 11, 2012

(54) DELAY-LOCKED LOOP CIRCUIT AND SEMICONDUCTOR DEVICE INCLUDING THE SAME

(75) Inventor: Chang-ho An, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 112 days.

(21) Appl. No.: 12/950,380

(22) Filed: Nov. 19, 2010

(65) Prior Publication Data

US 2011/0128056 A1    Jun. 2, 2011

(30) Foreign Application Priority Data

Nov. 30, 2009  (KR) .......................... 10-2009-0117083
Apr. 13, 2010  (KR) .......................... 10-2010-0033898

(51) Int. Cl.
*H03L 7/06* (2006.01)
(52) U.S. Cl. .......................... 327/158; 327/156; 327/161
(58) Field of Classification Search .................. 327/156, 327/158, 161
See application file for complete search history.

(56) References Cited

U.S. PATENT DOCUMENTS

| 2006/0139076 A1 | 6/2006 | Park |
| 2010/0264968 A1* | 10/2010 | Ko et al. ...................... 327/158 |

FOREIGN PATENT DOCUMENTS

| JP | 2006-060332 A | 3/2006 |
| JP | 2008-042340 A | 2/2008 |
| JP | 2008-067365 A | 3/2008 |
| KR | 10-2004-0102282 A | 12/2004 |
| KR | 10-0712993 B1 | 4/2007 |

* cited by examiner

*Primary Examiner* — John Poos
(74) *Attorney, Agent, or Firm* — Sughrue Mion, PLLC

(57) ABSTRACT

A delay-locked loop (DDL) circuit and a semiconductor device including the same are provided. The DDL circuit includes: a control voltage generator for generating a control voltage corresponding to a delay difference between an input clock and a plurality of comparison clocks by comparing the input clock with the plurality of comparison clocks that are sequentially generated and have different delays; a pulse width adjuster for adjusting a pulse width of the input clock according to a delay difference between the input clock and an arbitrary comparison clock of the comparison clocks and for generating a pulse-width-adjusted input clock as an adjusted input clock; and a delay unit for delaying the adjusted input clock in response to the control voltage and for outputting the delayed adjusted input clock as the comparison clocks and output clocks.

29 Claims, 24 Drawing Sheets

(a)

(b)

(a)

(b)

(a)

(b)

(a)

(b)

(a)

(b)

(a)

(b)

(a)

(b)

(a)

(b)

DELAY-LOCKED LOOP CIRCUIT AND SEMICONDUCTOR DEVICE INCLUDING THE SAME

CROSS-REFERENCE TO RELATED APPLICATIONS

This application claims priority from Korean Patent Application No. 10-2009-0117083, filed on Nov. 30, 2009, and Korean Patent Application No. 10-2010-0033898, filed on Apr. 13, 2010, in the Korean Intellectual Property Office, the disclosures of which are incorporated herein in their entirety by reference.

SUMMARY

Apparatuses consistent with the exemplary embodiments relate to a delay-locked loop (DLL) circuit, and more particularly, to a delay-locked loop (DLL) circuit that operates stably in a wide band and a semiconductor device including the DLL circuit.

Delay-locked loop (DLL) circuits have a small delay range. Thus, it is not easy to apply specification to DLL circuits. Also, in related DLL circuits, as a power supply voltage is varied, a phase error of a semiconductor device including a DLL circuit is varied so that the DLL circuit may become unstable.

One or more exemplary embodiments provide a delay-locked loop (DLL) circuit that increases a delay range and operates in a stable manner regardless of a variation in a power supply voltage, and a semiconductor device including the DLL circuit.

According to an aspect of the exemplary embodiments, there is provided a delay-locked loop (DLL) circuit including: a control voltage generator for generating a control voltage corresponding to a delay difference between an input clock and a plurality of comparison clocks by comparing the input clock with the plurality of comparison clocks that are sequentially generated and have different delays; a pulse width adjuster, e.g., a pulse width adjusting unit, for adjusting a pulse width of the input clock according to a delay difference between the input clock and an arbitrary comparison clock of the comparison clocks and for generating a pulse-width-adjusted input clock as an adjusted input clock; and a delay unit for delaying the adjusted input clock in response to the control voltage and for outputting the delayed adjusted input clock as the comparison clocks and output clocks.

The pulse width adjuster may adjust the pulse width of the input clock by using the arbitrary comparison clock as the comparison clocks that are delayed by the comparison clocks and are feed-back.

The pulse width adjuster may generate the adjusted input clock to have a pulse width that is greater than the pulse width of the input clock by the delay difference between the input clock and the arbitrary comparison clock.

The pulse width adjuster may include a flipflop for receiving the input clock from a clock terminal and receiving the arbitrary comparison clock from a reset terminal, the flipflop generating the adjusted input clock that is activated at a rising edge of the input clock and deactivated at a rising edge of the arbitrary comparison clock.

The pulse width adjuster may include: an inverter terminal including a plurality of inverters connected in series; a NAND gate in which a NAND operation is performed on the arbitrary comparison clock and an output of the inverter terminal; and a set-reset (SR) latch having an end connected to the output of the inverter terminal and the other end connected to the input clock, the SR latch generating the adjusted-input clock that is activated at the rising edge of the input clock and deactivated at the rising edge of the arbitrary comparison clock.

The pulse width adjuster may include: an inverter terminal including a plurality of inverters connected in series; a NAND gate in which a NAND operation is performed on the arbitrary comparison clock and an output of the inverter terminal; and a set-reset (SR) latch having an end connected to an inverted output of the NAND gate and the other end connected to the input clock, the SR latch generating the adjusted-input clock that is activated at the rising edge of the input clock and deactivated at the rising edge of the arbitrary comparison clock.

The arbitrary comparison clock may be a comparison clock having a smallest delay among the plurality of comparison clocks.

The control voltage generator may include: a detector for detecting a delay difference between the input clock and the comparison clocks and for outputting an up signal and a down signal that correspond to the delay difference between the input clock and the comparison clocks; a charge pump for charging or discharging electric charges into or from a first node in response to the up signal and the down signal; a current source generator for supplying current to the charge pump or discharging the current from the charge pump; and a filter for filtering a voltage of the first node to output the filtered voltage as the control voltage.

The detector may include: a first detector for performing coarse lock; and a second detector for performing fine lock, wherein the charge pump includes: a first charge pump for charging or discharging the electric charges into or from the first node in response to a first up signal and a first down signal that are supplied by the first detector; and a second charge pump for charging or discharging the electric charges into or from the first node in response to a second up signal and a second down signal that are supplied by the second detector.

The current source generator may include: a resistor having an end connected to a power supply voltage; a first PMOS transistor having an end connected to the resistor; a first NMOS transistor having an end connected to the first PMOS transistor and the other end connected to a ground voltage; a second PMOS transistor having an end connected to the power supply voltage and the other end connected to a gate of the first PMOS transistor; a second NMOS transistor having an end connected to the second PMOS transistor, the other end connected to the ground voltage, and a gate connected to the end and a gate of the first NMOS transistor; and a source transistor having the same size as the second PMOS transistor, connected between the power supply voltage and the ground voltage and having a gate connected to the gate of the second PMOS transistor, the source transistor supplying a source current corresponding to current that flows through the second NMOS transistor from the second PMOS transistor to the charge pump.

The delay unit may include a first delay line and a second delay line each being activated in different manners in response to the control signal corresponding to an operating speed of a semiconductor device at which the DLL circuit is installed, wherein each of the first and second delay lines includes a plurality of delayers connected in series.

Each of the plurality of delayers of the first delay line and each of the plurality of delayers of the second delay line are provided by the number of the comparison clocks and the number of the output clocks and delay the adjusted input clock or an output of a delayer that is placed at a relatively front end of the delayers to generate the comparison clocks and the output clocks.

Each of the delayers of the first delay line and each of the delayers of the second delay line include: a plurality of inverters connected in series; first transistors gated due to the control voltage and connected to the power supply voltage and an end of the inverter corresponding to the power supply voltage among the inverters; and second transistors gated due to the control voltage and connected to the ground voltage and the other end of the inverter corresponding to the ground voltage among the inverters, wherein each of the first transistors and each of the second transistors are provided based on the number of the inverters, and sizes of transistors disposed in the delayers of the first delay line are different from sizes of transistors disposed in the delayers of the second delay line, or the second transistors are fewer in number than the number of the inverters, and the sizes of transistors disposed in the delayers of the first delay line are the same as the sizes of transistors disposed in the delayers of the second delay line, or the sizes of transistors disposed in the delayers of the first delay line are the same as the sizes of transistors disposed in the delayers of the second delay line, and the number of inverters disposed in the delayers of the first delay line is different from the number of inverters disposed in the delayers of the second delay line.

The delay unit may include: a first MUX for selecting output clocks generated from one delay line in response to the control signal from among a plurality of output clocks generated from the first delay line and a plurality of output clocks generated from the second delay line, and for outputting the selected output clocks to an external device; and a second MUX for selecting comparison clocks generated from one delay line in response to the control signal from among a plurality of comparison clocks generated from the first delay line and a plurality of comparison clocks generated from the second delay line, to an external device, for supplying the arbitrary comparison clock to the pulse width adjuster and for supplying the remaining comparison clocks excluding the arbitrary comparison clock to the control voltage generator.

The DLL circuit may be installed at a display driver integrated circuit (IC), and the output clocks are operating clocks of the display driver IC.

According to another aspect of the inventive concept, there is provided a delay-locked loop (DLL) circuit including: a control voltage generator for generating a control voltage corresponding to a delay difference between an input clock and a plurality of comparison clocks by comparing the input clock with the plurality of comparison clocks that are sequentially generated and have different delays; and a delay unit for delaying the input clock in response to the control voltage and for outputting the delayed input clock as the comparison clocks and output clocks and for including a first delay line and a second delay line, wherein each of the first delay line and the second delay line includes a plurality of delayers which are connected in series and switches that supply current to the delayers corresponding to the control voltage.

Each of the delayers of the first delay line and each of the delayers of the second delay line may include: a plurality of inverters connected in series; at least one first current generator for supplying current corresponding to the difference between a power supply voltage and the control voltage, to the inverters; at least one first switch connected to the first current generator for controlling of on-off of the first current generator.

The first current generator may be a PMOS transistor having one end connected to a corresponding inverter among the inverters and gated by an output of an inverter receiving an output of the corresponding inverter.

Each of the delayers of the first delay line and each of the delayers of the second delay line may include: a plurality of inverters connected in series; at least one second current generator for supplying current corresponding to the difference between a ground voltage and the control voltage, to the inverters; at least one second switch connected to the second current generator for controlling of on-off of the second current generator.

The second current generator may be a NMOS transistor having one end connected to a corresponding inverter among the inverters and gated by an output of an inverter receiving an output of the corresponding inverter.

BRIEF DESCRIPTION OF THE DRAWINGS

The exemplary embodiments will be more clearly understood from the following detailed description taken in conjunction with the accompanying drawings in which.

DETAILED DESCRIPTION OF THE EXEMPLARY EMBODIMENTS

Figure 1:
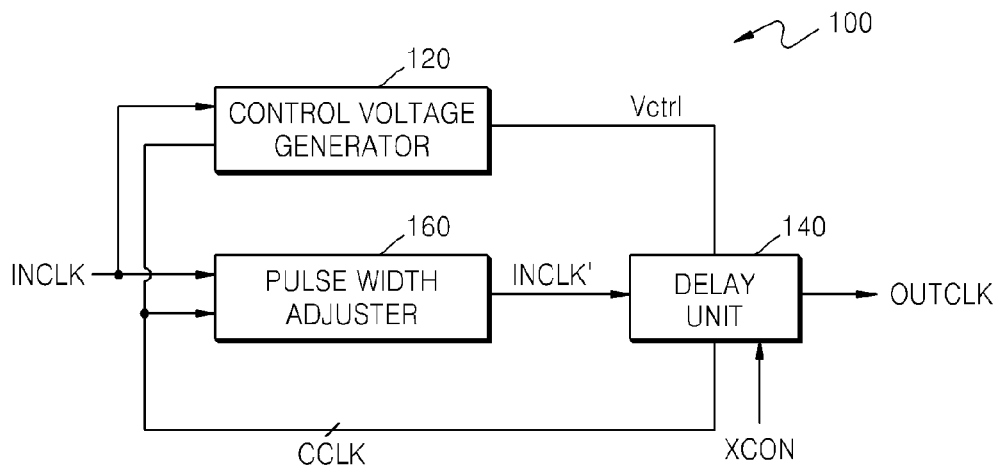
FIG. 1 is a block diagram of a delay-locked loop (DLL) circuit according to an exemplary embodiment.

The attached drawings for illustrating exemplary embodiments are referred to in order to gain a sufficient understanding of the exemplary embodiments, the merits thereof, and the objectives accomplished by the implementation of the exemplary embodiments. However, the exemplary embodiments are not required to, and may not, accomplish any of these objectives. Hereinafter, the exemplary embodiments will be described with reference to the attached drawings. Like reference numerals in the drawings denote like elements.

FIG. 1 is a block diagram of a delay-locked loop (DLL) circuit 100 according to an exemplary embodiment. Referring to FIG. 1, the DLL circuit 100 according to the present exemplary embodiment may be an analog delay-locked loop circuit. Also, the DLL circuit 100 according to the present exemplary embodiment may be installed at a display driver integrated circuit (IC). In particular, the DDL 100 of FIG. 1 may be installed at a liquid crystal display (LCD) driver IC.

The DLL circuit 100 of FIG. 1 changes the phase state of an input clock INCLK supplied to the DLL circuit 100, into in-phase states of a plurality of comparison clocks CCLK by comparing the input clock INCLK with the plurality of comparison clocks CCLK in which the input clock INCLK is sequentially generated, so as to generate output clocks OUTCLK that are used in a semiconductor device (not shown) in which the DLL circuit 100 is installed. In other words, the DLL circuit 100 of FIG. 1 changes the phase state of the input clock INCLK into the in-phase states of the comparison clocks CCLK to generate the output clocks OUTCLK that are used in the semiconductor device (not shown).

Figure 2:
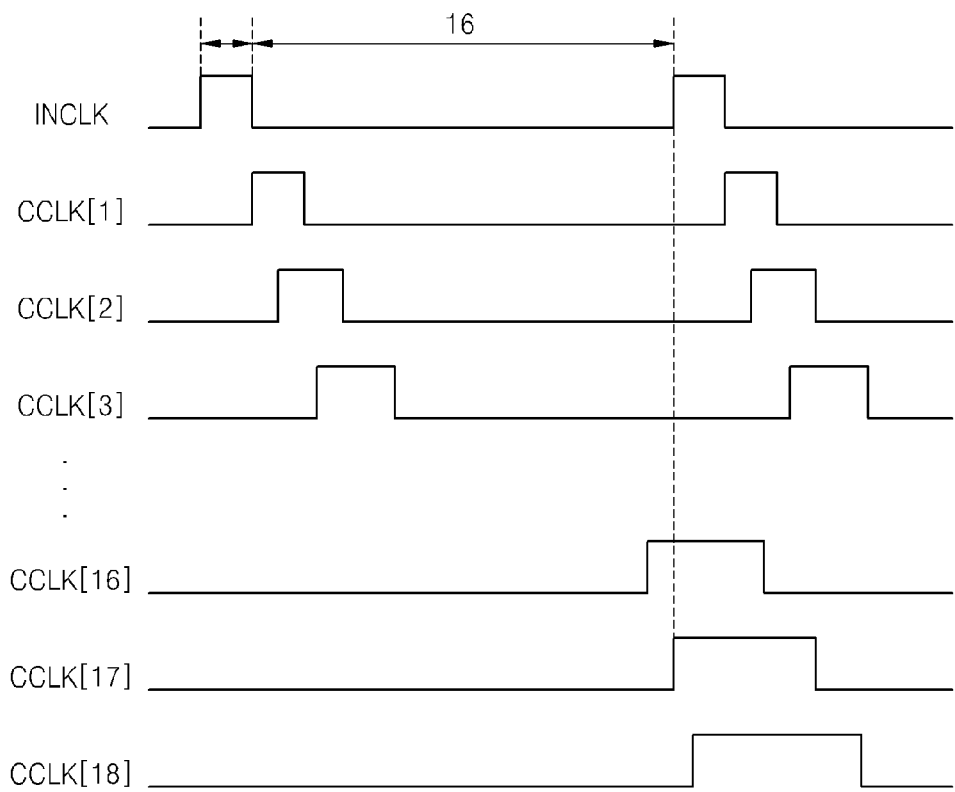
FIG. 2 shows an input clock and comparison clocks of the DLL circuit of FIG. 1, according to an exemplary embodiment.

The input clock INCLK and the comparison clocks CCLK may be as illustrated in FIG. 2.

FIG. 2 shows 18 comparison clocks CCLK, in particular. Each of the comparison clocks CCLK is represented as CCLK[i]. When there are n comparison clocks CCLK (where n is a natural number that is greater than or equal to 2), i represents a natural number between 1 and n.

When the pulse width of the input clock INCLK is 1 and a distance between pulses of the input clock INCLK is m (where m is a natural number that is less than n), the rising edge of each of pulses of the comparison clocks CCLK and a pulse width thereof may be set so that m comparison clocks CCLK may be generated between the pulses of the input clock INCLK. In this case, m may be varied according to the number of bits of data that are to be processed by the semiconductor device including the DLL circuit 100 of FIG. 1.

In particular, FIG. 2 shows an example in which a distance between the pulses of the input clock INCLK is 16, and 16 comparison clocks CCLK (i.e., CCLK[1] to CCLK[16]) are generated between the pulses of the input clock INCLK. Also, the pulse width of each of the pulses of the comparison clocks CCLK of FIG. 2 increases sequentially. For example, the pulse width of the second comparison clock CCLK[2] is larger than that of the first comparison clock CCLK[1], and the pulse width of the third comparison clock CCLK[3] is larger than that of the second comparison clock CCLK[2].

Referring back to FIG. 1, the DLL circuit 100 may include a control voltage generator 120, a delay unit 140, and a pulse width adjuster 160, e.g., a pulse width adjusting unit, so as to change the phase state of the input clock INCLK into the in-phase state of the comparison clocks CCLK.

The control voltage generator 120 compares the input clock INCLK with the comparison clocks CCLK to generate a control voltage Vctrl corresponding to a delay difference between the input clock INCLK and the comparison clocks CCLK. The pulse width adjuster 160 increases the pulse width of the input clock INCLK by reflecting the delay difference between the input clock INCLK and a predetermined comparison clock CCLK of the comparison clocks CCLK that are delayed by the delay unit 140 that will be described later. The delay unit 140 delays the input clock INCLK' having the increased pulse width output by the pulse width adjuster 160 in response to the control voltage Vctrl applied by the control voltage generator 120 to generate output clocks OUTCLK.

Figure 3:
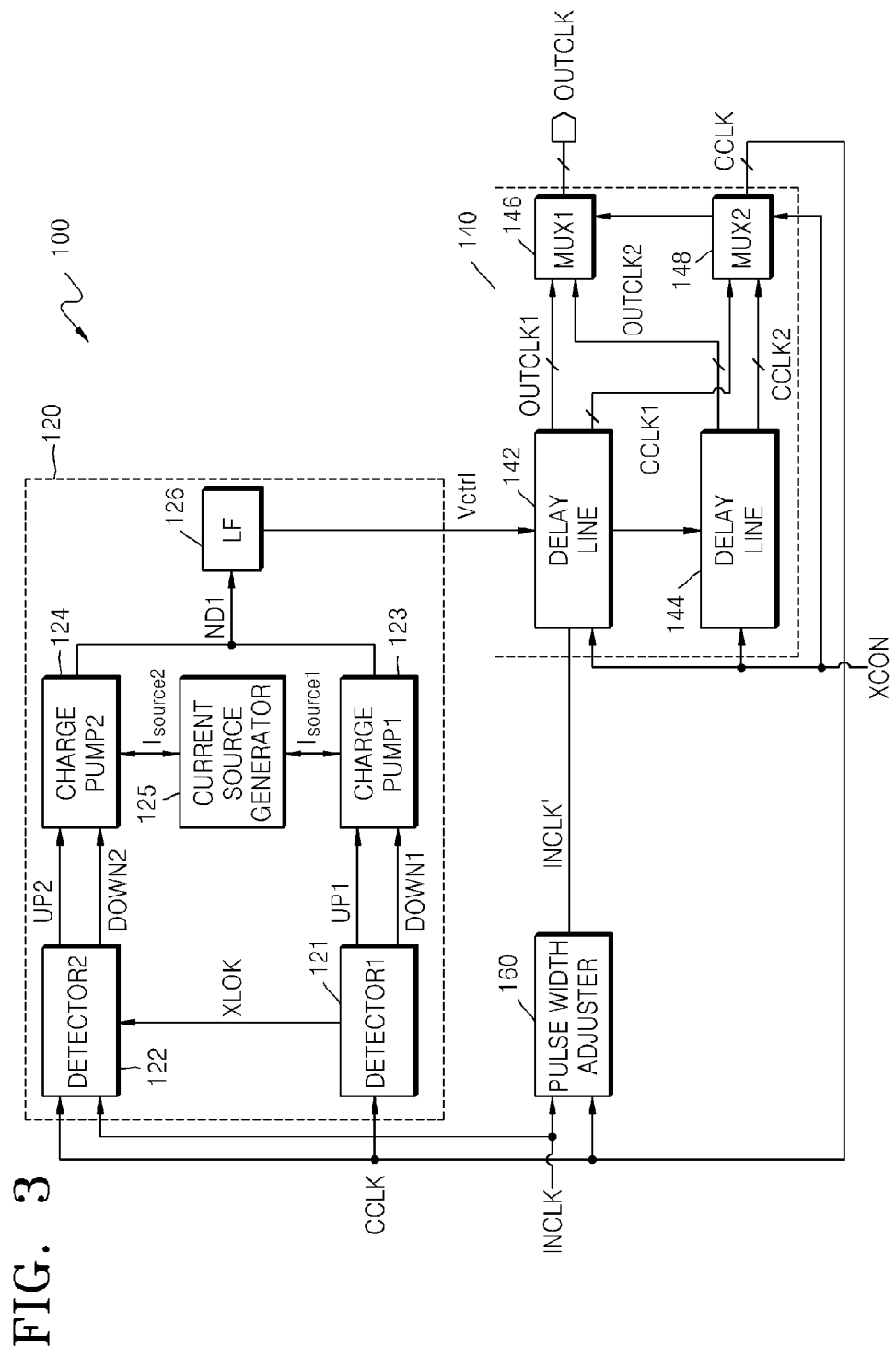
FIG. 3 is a detailed block diagram of the DLL circuit of FIG. 1.

Hereinafter, the structure and operation of the DLL circuit 100 of FIG. 1 will be described with reference to FIG. 3 in more detail. FIG. 3 is a detailed block diagram of the DLL circuit 100 of FIG. 1.

The control voltage generator 120 may include detectors 121 and 122, charge pumps 123 and 124, a current source generator 125, and a filter 126.

The detectors 121 and 122 may detect a phase (or delay) difference between the input clock INCLK and the comparison clocks CCLK and may output up signals UP1 and UP2 or down signals DOWN1 and DOWN2 that correspond to the phase difference between the input clock INCLK and the comparison clocks CCLK. The detectors 121 and 122 of the control voltage generator 120 may perform a coarse lock and a fine lock, respectively, so as to reduce a locking time. A comparison clock CCLK applied to the first detector 121 and a comparison clock CCLK applied to the second detector 122 may be different from each other. For example, a fourth comparison clock CCLK4 or the like may be applied to the first detector 121, and a fifteenth comparison clock CCLK15 or the like may be applied to the second detector 122.

The charge pumps 123 and 124 may charge electric charges into a first node ND1 or discharge the electric charges from the first node ND1 in response to the up signals UP1 and UP2 or the down signals DOWN1 and DOWN2 that are output by the first and second detectors 121 and 122. When the first detector 121 and the second detector 122 are provided, as illustrated in FIG. 3, the charge pumps 123 and 124 may include a first charge pump 123 that operates in response to the up signal UP1 and the down signal DOWN1 that are output by the first detector 121, and a second charge pump 124 that operates in response to the up signal UP2 and the down signal DOWN2 that are output by the second detector 122.

The charging or discharging operation of the charge pumps 123 and 124 may be performed when currents $I_{source1}$ and $I_{source2}$ are supplied by the current source generator 125 to the charge pump 123 and 124 or the currents $I_{source1}$ and $I_{source2}$ are discharged from the charge pumps 123 and 124 into the current source generator 125.

Figure 4:
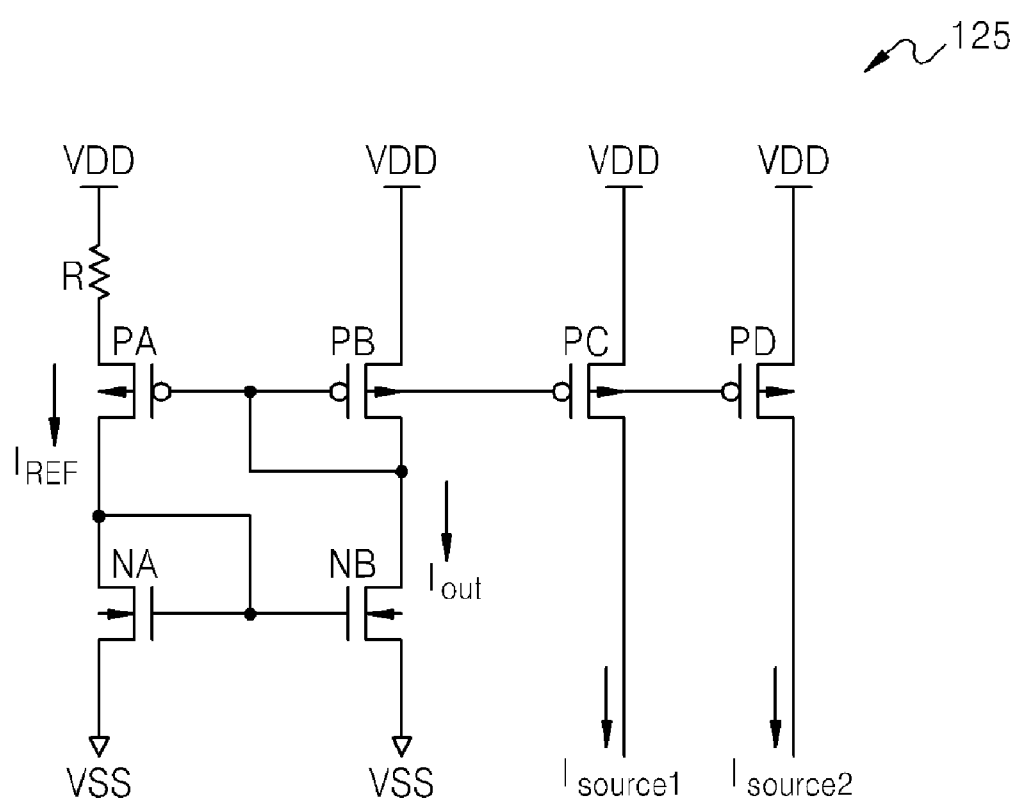
FIG. 4 is a detailed diagram of a current source generator of FIG. 3 according to an exemplary embodiment.

FIG. 4 is a detailed diagram of the current source generator 125 of FIG. 3. Referring to FIG. 4, the current source generator 125 according to the present exemplary embodiment may include a resistor R having an end connected to a power supply voltage VDD, a first PMOS transistor PA having an end connected to the resistor R, a first NMOS transistor NA having an end connected to the first PMOS transistor PA and the other end connected to a ground voltage VSS, a second PMOS transistor PB having an end connected to the power supply voltage VDD and a gate and the other end connected to a gate of the first PMOS transistor PA, and a second NMOS transistor NB having an end connected to the other end of the second PMOS transistor PB and a gate connected to a gate and an end of the first NMOS transistor NA.

An output current $I_{out}$ that flows through the second NMOS transistor NB may be obtained by using Equation 1:

$$I_{out} = \frac{2}{\mu_p C_{ox}(W/L)_p} \cdot \frac{1}{R_s^2}\left(1 - \frac{1}{\sqrt{K}}\right)^2, \quad (1)$$

where $(W/L)_p$ is the size of the second PMOS transistor PB, and K is a constant that represents the ratio of the size of the first PMOS transistor PA to the size of the second PMOS transistor PB. Also, $\mu_p C_{ox}$ is a transconductance parameter, and $R_s$ is a resistance of the resistor R. As shown in Equation 1, the output current $I_{out}$ may be generated regardless of the power supply voltage VDD.

The current source generator 125 of FIG. 4 may further include source transistors each being the same size as that of the second PMOS transistor PB, i.e., a third PMOS transistor PC and/or a fourth PMOS transistor PD. The third PMOS transistor PC may supply the first source current $I_{source1}$ to the first charge pump 123. Also, the fourth PMOS transistor PD may supply the second source current $I_{source2}$ to the second charge pump 124. The third PMOS transistor PC and the fourth PMOS transistor PD may be the same size as that of the second PMOS transistor PB. Thus, the first source current $I_{source1}$ and the second source current $I_{source2}$ may be the same as the output current $I_{out}$. The exemplary embodiment is not limited thereto, and the third PMOS transistor PC and the fourth PMOS transistor PD may not be the same size as that of the second PMOS transistor PB. In this case, magnitudes of the first source current $I_{source1}$ and the second source current $I_{source1}$ may be adjusted in the first and second charge pumps 123 and 124.

In detail, the control voltage generator 125 of FIG. 4 may generate the control voltage Vctrl, which is not affected by a variation of the power supply voltage VDD. Thus, the semiconductor device including the DLL circuit 100 of FIG. 1 can maintain stable operation.

Referring back to FIG. 3, the filter 126 may filter a voltage of the first node ND1 to output the filtered voltage of the first node ND1 as the control voltage Vctrl. The filter 126 of FIG. 3 may be a low pass filter, in particular.

The control voltage Vctrl output by the control voltage generator 120 is applied to the delay unit 140. The delay unit 140 may include delay lines 142 and 144 that delay the adjusted input clock INCLK' applied by the pulse width adjuster 160 by an amount of time corresponding to the control voltage Vctrl. The adjusted input clock INCLK' may be delayed by the delay lines 142 and 144 and may be output as the comparison clocks CCLK and the output clocks OUTCLK.

The delay lines 142 and 144 may include the first delay line 142 and the second delay line 144. One of the first delay line 142 and the second delay line 144 is activated in response to a control signal XCON (see FIG. 1). Although not shown, a unit for activating the first delay line 142 or the second delay line 144 according to a logic level of the control signal XCON, such as a switch, a transistor or the like, may be further included.

The control signal XCON may indicate whether the semiconductor device in which the DLL circuit 100 of FIG. 1 is installed operates with a high frequency. For example, when the semiconductor device operates with the high frequency, the control signal XCON may be set to logic high "H", and the first delay line 142 may be activated in response to the control signal XCON. On the other hand, when the semiconductor device does not operate with the high frequency, the control signal XCON may be set to logic low "L", and the second delay line 144 may be activated in response to the control signal XCON.

When data of the semiconductor device is processed in units of 8 bits, if the semiconductor device operates in the frequency range of 265 to 465 Mhz, the semiconductor device may operate with a high frequency. Also, when data of the semiconductor device is processed in units of 6 bits, if the semiconductor device operates in the frequency range of 159 to 445 Mhz, the semiconductor device may operate with a high frequency.

Figure 5:
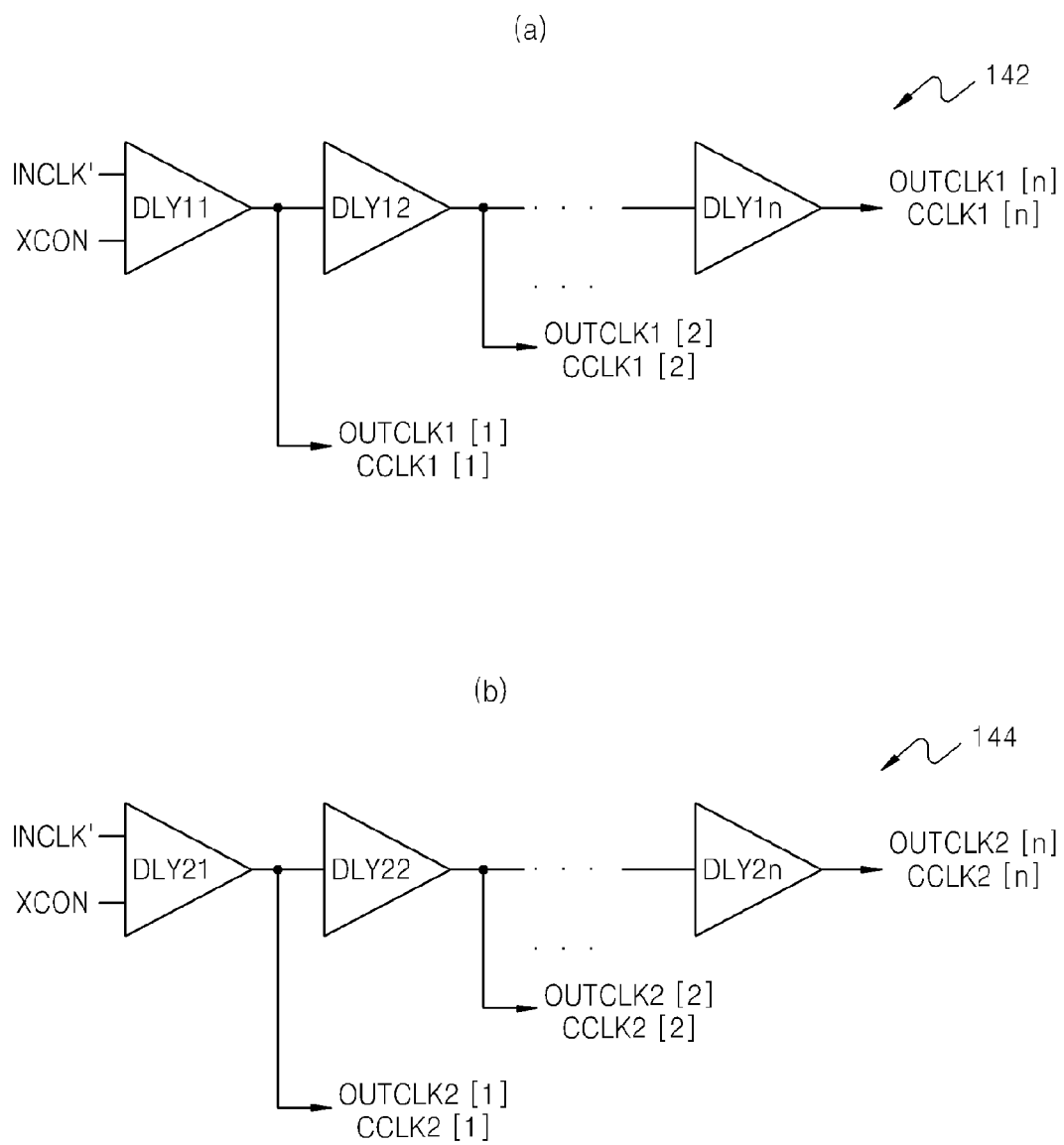
FIGS. 5A and 5B are detailed diagrams of first and second delay lines of the DLL circuit of FIG. 3.

FIGS. 5A and 5B are detailed diagrams of first and second delay lines 142 and 144 of the DLL circuit of FIG. 3. Referring to FIG. 5A, which is a detailed diagram of the first delay line 142 of FIG. 3, the first delay line 142 may include a plurality of delayers DLY11, DLY12, ..., and DLY1n that are connected to one another in series. The number of the delayers DLY11, DLY12, ..., and DLY1n of the first delay line 142 may be the number n of comparison clocks CCLK1. In other words, the delayers DLY11, DLY12, ..., and DLY1n of the first delay line 142 may output comparison clocks CCLK1 of a plurality of comparison clocks CCLK1 having different delays, respectively. For example, the first delayer DLY11 of the first delay line 142 may output a first comparison clock CCLK1[1], and the second delayer DLY12 of the first delay line 142 may output a second comparison clock CCLK1[2], and a n-th delayer DLY1n of the first delay line 142 may output a n-th comparison clock CCLK1[n].

Similarly, the delayers DLY11, DLY12, ..., and DLY1n of the first delay line 142 may output output clocks OUTCLK1 of a plurality of output clocks OUTCLK1 having difference delays, respectively. For example, the first delayer DLY11 of the first delay line 142 may output a first output clock OUTCLK1[1], and the second delayer DLY12 of the first delay line 142 may output a second output OUTCLK1[2], and a n-th delayer DLY1n of the first delay line 142 may output a n-th output clock OUTCLK1[n].

Referring to FIG. 5B, which is a detailed diagram of the second delay line 144 of FIG. 3, the first delay line 144 may include a plurality of delayers DLY21, DLY22, ..., and DLY2n that are connected to one another in series, like the first delay line 142. In other words, the number of the delayers DLY21, DLY22, ..., and DLY2n of the second delay line 144 may be the number n of comparison clocks CCLK2. In other words, the delayers DLY21, DLY22, ..., and DLY2n of the second delay line 144 may output comparison clocks CCLK2 of a plurality of comparison clocks CCLK2 having difference delays, respectively. For example, the first delayer DLY21 of the second delay line 144 may output a first comparison clock CCLK2[1], and the second delayer DLY22 of the second delay line 144 may output a second comparison clock CCLK2[2], and a n-th delayer DLY2n of the second delay line 144 may output a n-th comparison clock CCLK2[n].

Similarly, the delayers DLY21, DLY22, ..., and DLY2n of the second delay line 144 may output output clocks OUTCLK2 of a plurality of output clocks OUTCLK2 having difference delays, respectively. For example, the first delayer DLY21 of the second delay line 144 may output a first output clock OUTCLK2[1], and the second delayer DLY22 of the second delay line 144 may output a second output OUTCLK2[2], and a n-th delayer DLY2n of the second delay line 144 may output a n-th output clock OUTCLK2[n].

Figure 6:
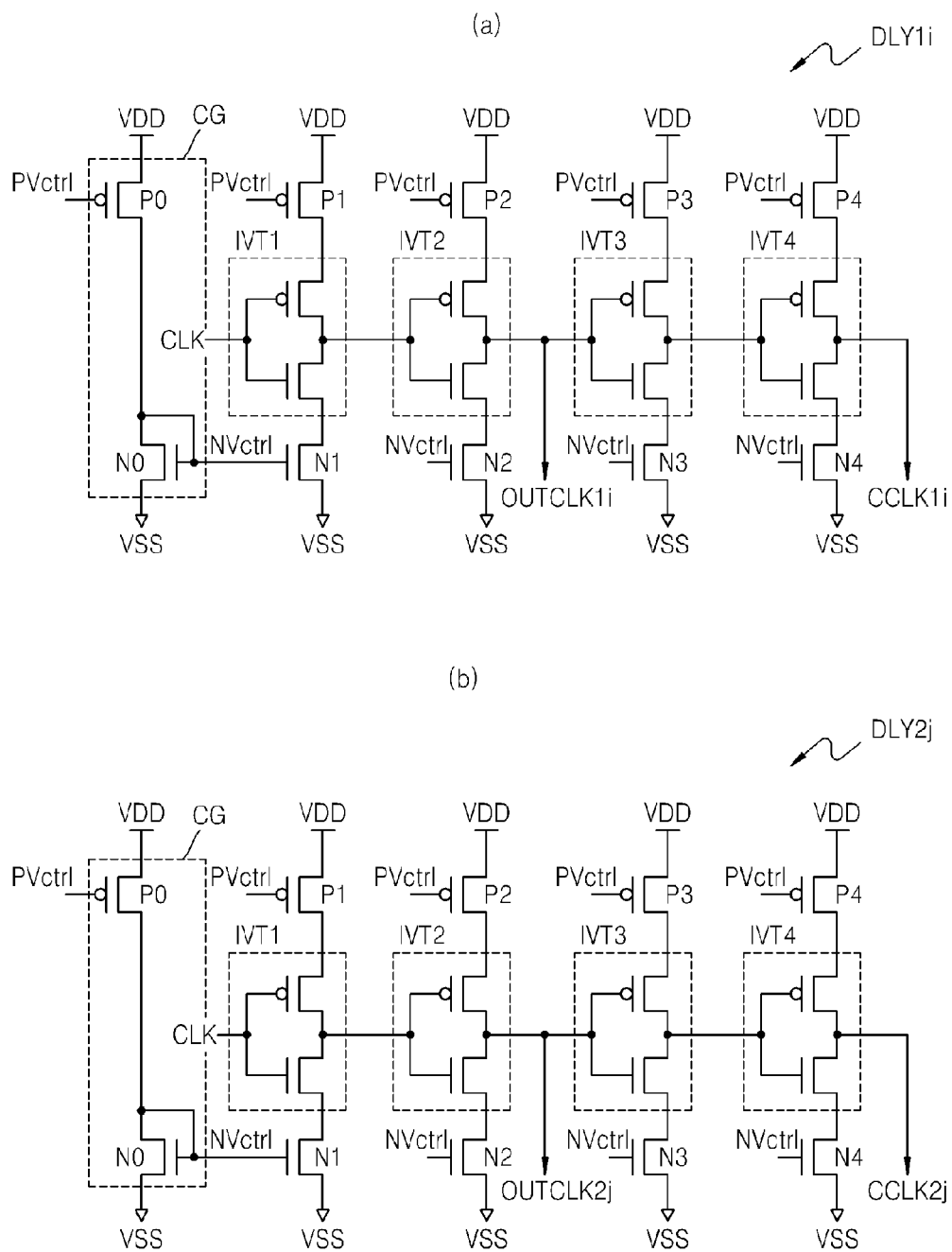
FIGS. 6A and 6B show delayers of FIGS. 5A and 5B, according to an exemplary embodiment.
Figure 7:
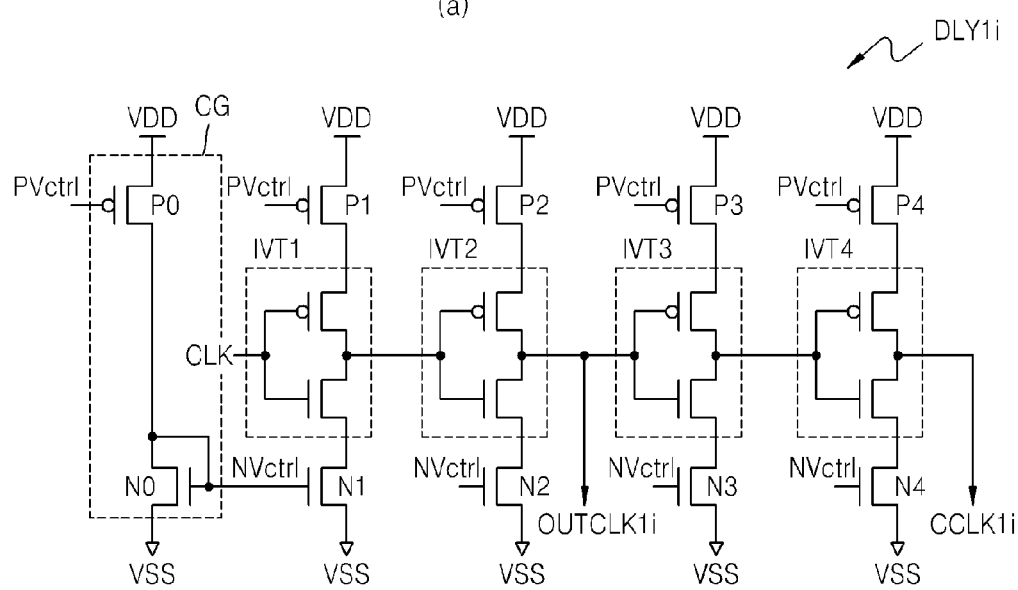
FIGS. 7A and 7B show delayers of FIGS. 5A and 5B, according to another exemplary embodiment.
Figure 7:
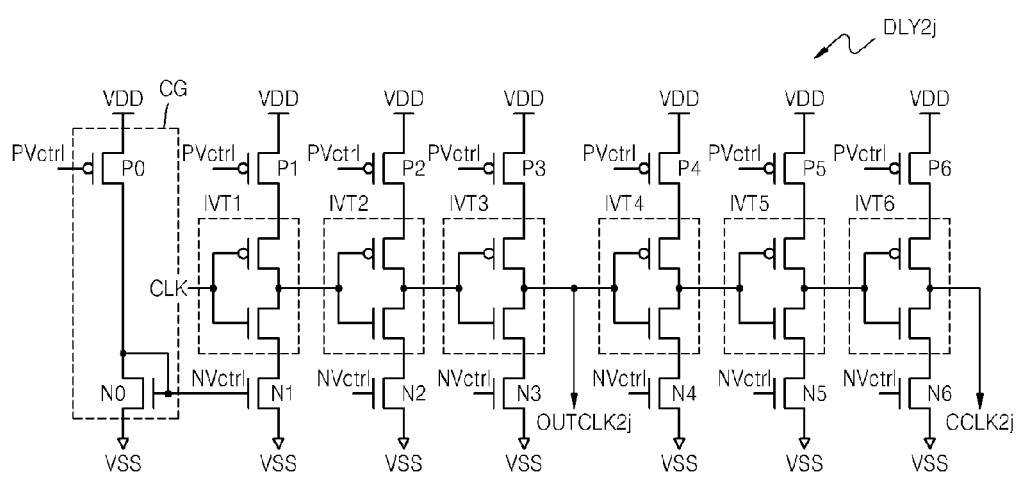

The number of delayers DLY21, DLY22, ..., and DLY2n of the second delay line 144 that is activated in a low-speed device may be greater than that of the delayers DLY11, DLY12, ..., and DLY1n of the first delay line 142. A difference between the delayers of the first and second delay lines 142 and 144 will be described with reference to FIGS. 6 and 7.

Referring to FIGS. 5A and 5B, comparison clocks and output clocks of the first delay line 142 are represented by CCLK1[i] and OUTCLK1[i], respectively, and comparison clocks and output clocks of the second delay line 144 that is generated by the low-speed device are represented by CCLK2[i] and OUTCLK2[i], respectively, in order to classify the comparison clocks and the output clocks of the first delay line 142 that is generated by a high-speed device. Also, delayers of the first delay line 142 are represented by DLY1i, and delayers of the second delay line 144 are represented by DLY2i. This also applies to the following description.

FIG. 6A is a circuit diagram of delayers of FIG. 5A, according to an exemplary embodiment. Referring to FIG. 6A, each of the delayers DLY1i of the first delay line 142 may include inverters IVT1 to IVT4, PMOS transistor P1 to P4 that are connected to the power supply voltage VDD and the inverters IVT1 to IVT4, and NMOS transistors N1 to N4 that are connected between the inverters IVT1 to IVT4 and the ground voltage VSS.

The first inverter IVT1 that is placed at a first end of each delayer DLY1i of the first delay line 142 inverts an output clock CLK of a delayer that is placed at the front end of the delayer DLY1i including the first inverter IVT1, among the plurality of delayers DLY11, DLY12, ..., and DLY1n that are connected to one another in series and constitute the first delay line 142 of FIG. 5A, and the first inverter IVT1 performs a delay operation. The first inverter IVT1 of the first delayer DLY11 of the first delay line 142 inverts an adjusted input clock INCLK'.

The second through fourth inverters IVT2, IVT3, and IVT4 invert an output of an inverter that is connected to the front end of the delayer DLY1i and performs a delay operation.

The delayer DLY1i of FIG. 6A may output the adjusted input clock INCLK' that is delayed by the first inverter IVT1 and the second inverter IVT2 as an output clock OUTCLK1i and may delay the output clock OUTCLK1i via the third inverter IVT3 and the fourth inverter IVT4 and output a comparison clock CCLK1i. The exemplary embodiment is not limited thereto, and the output clock OUTCLK1i may be delayed more than the comparison clock CCLK1i and may be output.

Each of the PMOS transistors P1 to P4 and each of the NMOS transistors N1 to N4 may be gated due to the control voltage Vctrl and may adjust a delay due to the inverters IVT1 to IVT4 connected to the PMOS transistors P1 to P4 and the NMOS transistors N1 to N4. The PMOS transistors P1 to P4 may supply current that corresponds to a difference between the power supply voltage VDD and the control voltage Vctrl to the inverters IVT1 to IVT4, thereby adjusting delays of the inverters IVT1 to IVT4. Also, the NMOS transistors N1 to N4 may discharge the current that corresponds to a difference between the ground voltage VSS and the control voltage Vctrl from the inverters IVT1 to IVT4, thereby adjusting delays of the inverters IVT1 to IVT4.

Specifically, when a difference between a control voltage PVctrl applied to gates of the PMOS transistors P1 to P4 via the PMOS transistor P0 of a common gate terminal CG and the power supply voltage VDD is small, a large magnitude of current is supplied to the inverters IVT1 to IVT4, and the operating speed of each of the inverters IVT1 to IVT4 may be increased. Thus, delays caused by the inverters IVT1 to IVT4 may be decreased. On the other hand, when the difference between the control voltage PVctrl applied to gates of the PMOS transistors P1 to P4 via the PMOS transistor P0 of the common gate terminal CG and the power supply voltage VDD is large, a small magnitude of current is supplied to the inverters IVT1 to IVT4, and the operating speed of each of the inverters IVT1 to IVT4 may be decreased. Thus, delays caused by the inverters IVT1 to IVT4 may be increased. The control voltage PVctrl may be the control voltage Vctrl which are transmitted through the PMOS transistor P0 to the PMOS transistors P1 to P4.

Similarly, when a difference between a control voltage NVctrl applied to gates of the NMOS transistors N1 to N4 via the NMOS transistor N0 of the common gate terminal CG and the power supply voltage VDD is large, a large magnitude of current is discharged from the inverters IVT1 to IVT4, and the operating speed of each of the inverters IVT1 to IVT4 may be increased. Thus, delays caused by the inverters IVT1 to IVT4 may be decreased. On the other hand, when the difference between the control voltage NVctrl applied to the gates of the NMOS transistors N1 to N4 via the NMOS transistor N0 of the common gate terminal CG and the power supply voltage VDD is small, a small magnitude of current is discharged from the inverters IVT1 to IVT4, and the operating speed of each of the inverters IVT1 to IVT4 may be decreased. Thus, delays caused by the inverters IVT1 to IVT4 may be increased. The control voltage NVctrl may be the control voltage Vctrl which are transmitted through the NMOS transistor N0 to the NMOS transistors N1 to N4.

Referring to FIG. 6B, which is a circuit diagram of the delayers of FIG. 5B, according to an exemplary embodiment, each of delayers DLY2j (where j is a natural number that is less than or equal to n) may have the same structure as that of each of the delayers DLY1i of FIG. 6A. Each of the PMOS transistors P1 to P4 and each of the NMOS transistors N1 to N4 of the delayers DLY2j of FIG. 6B may be smaller than each of the PMOS transistors P1 to P4 and each of the NMOS transistors N1 to N4 of the delayers DLY1i of FIG. 6A. Thus, delays generated by the delayers DLY2j of FIG. 6B may be longer than those of the delayers DLY1i of FIG. 6A.

In this way, each delayer DLY1i of the first delay line 142 and each delayer DLY2j of the second delay line 144 include the same number of inverters, and the size of each of the transistors may be varied so that the delayer of the first delay line 142 and the second delay line 144 may be varied. However, the exemplary embodiment is not limited thereto. FIGS. 7A and 7B show delayers of FIG. 5, according to another exemplary embodiment. Referring to FIGS. 7A and 7B, each of the delayers DLY2j of the second delay line 144 may include more inverters and more transistors than the number of inverters and transistors included in each delayer DLY1i of the first delay line 142 so that a delay generated by the delayer DLY2j of the second delay line 144 may be longer than a delay generated by the delayer DLY1i of the first delay line 142.

Referring to FIGS. 7A and 7B, the delayer DLY1i of the first delay line 142 of FIG. 7A is the same as the delayer DLY1i of FIG. 6A. However, the delayer DLY2j of the second delay line 144 of FIG. 7B may include more inverters IVT1 to IVT6, more PMOS transistors P1 to P6 that are respectively connected to the inverters IVT1 to IVT6, and more NMOS transistors N1 to N6 than the inverters IVT1 to IVT4, the PMOS transistors P1 to P4, and the NMOS transistors N1 to N4 included in the delayer DLY1i of the first delay line 142 of FIG. 7A. Unlike in FIGS. 6A and 6B, the PMOS transistors P1 to P6 and the NMOS transistors N1 to N6 of the delayer DLY2j of FIG. 7B may have the same sizes of the PMOS transistors P1 to P4 and the NMOS transistors N1 to N4 of the delayer DLY1i of FIG. 7A.

The delayer DLY2j of FIG. 7B may delay an input clock CLK by using three inverters IVT1 to IVT3, which are placed at a relatively front end of the delayer DLY2j, to output the delayed input clock CLK as an output clock OUTCLK2j and may delay the output clock OUTCLK2j by using the remaining three inverters IVT4 to IVT6, which are placed at a relatively rear end of the delayer DLY2j, to output the delayed output clock OUTCLK2j as a comparison clock CCLK2j.

Figure 8:
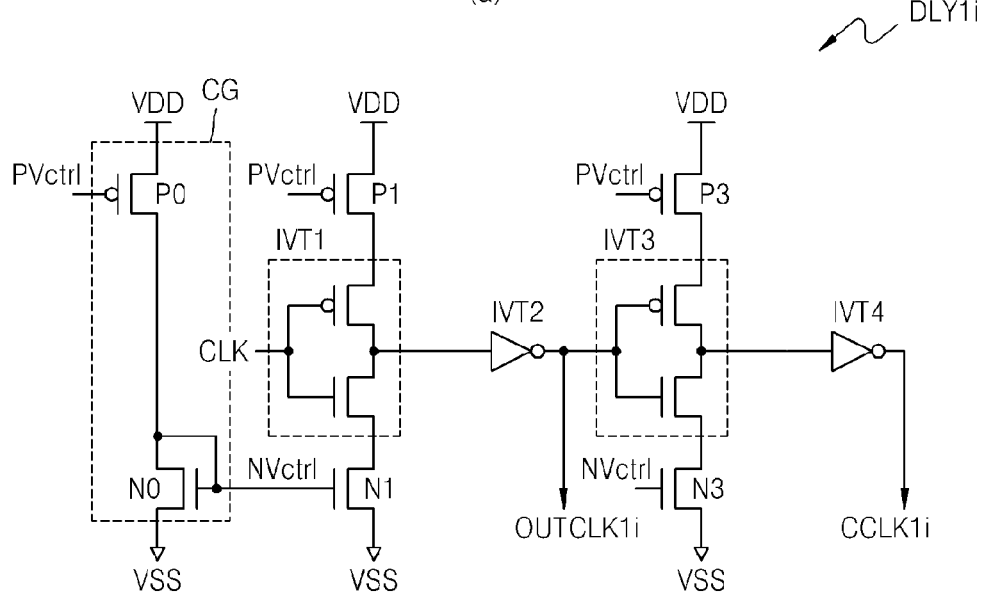
FIGS. 8A and 8B show delayers of FIGS. 5A and 5B, according to another exemplary embodiment.
Figure 8:
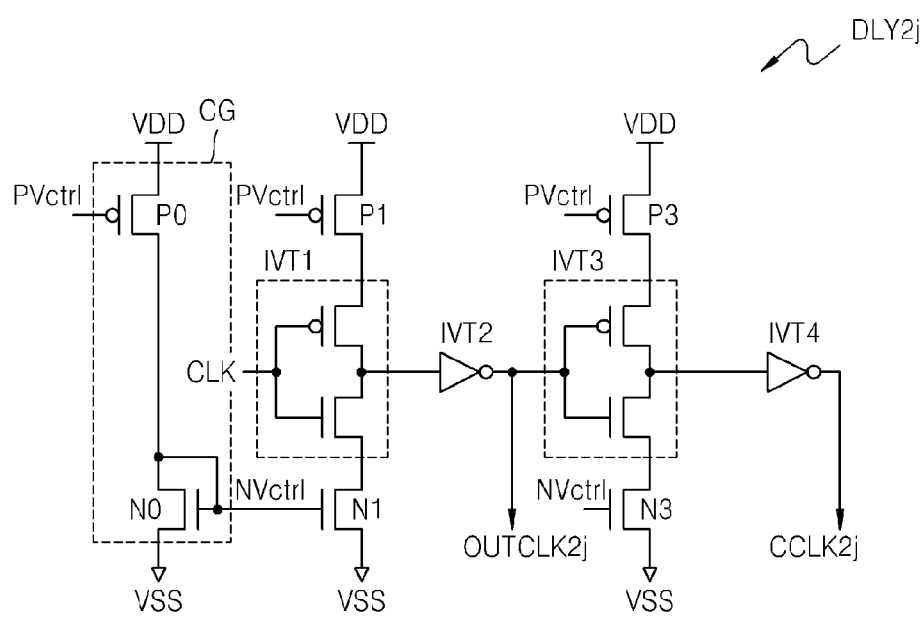

Transistors are disposed at both ends of all of inverters of the delayers of FIGS. 6A and 6B and the delayers of FIGS. 7A and 7B. However, the exemplary embodiment is not limited thereto. FIGS. 8A and 8B show the delayer DLY1i of the first delay line 142 of FIG. 5A and the delayer DLY2j of the second delay line 144 of FIG. 5B, according to another exemplary embodiment. Referring to FIGS. 8A and 8B, the delayer DLY1i of the first delay line 142 and the delayer DLY2j of the second delay line 144 may include inverters IVT2 and IVT4 that do not include transistors at their both ends.

Referring back to FIG. 3, the delay unit 140 may further include a MUX1 146 and a MUX2 148. The MUX1 146 and the MUX2 148 may include the first MUX1 146 that selects output clocks OUTCLK from among output clocks OUTCLK1 output from the first delay line 142 in response to the control signal XCON and output clocks OUTCLK2 output from the second delay line 144 and outputs the selected output clocks OUTCLK, and the second MUX2 148 that selects comparison clocks CCLK from among comparison clocks CCLK1 output from the first delay line 142 and comparison clocks CCLK2 output from the second delay line 144.

The output clocks OUTCLK output from the first MUX1 146 may be applied to other elements of the semiconductor device including the DLL circuit 100 of FIG. 1. For example, when the semiconductor device is an LCD, the output clocks OUTCLK may be applied to a driver IC. The semiconductor device may perform operations based on the output clocks OUTCLK.

The comparison clocks CCLK output from the second MUX2 148 may be feed back to the control voltage generator 120.

Also, the DLL circuit 100 of FIG. 1 may feedback predetermined clocks of the comparison clocks CCLK output from the delay unit 140 via the pulse width adjuster 160. For example, the first comparison clock CCLK[1] of FIG. 2 that is delayed by the delay unit 140 by a first time may be fed back by the pulse width adjuster 160. Hereinafter, for convenience, only a case where the delayed first comparison clock CCLK[1] is fed back by the pulse width adjuster 160 will be described.

Figure 9:
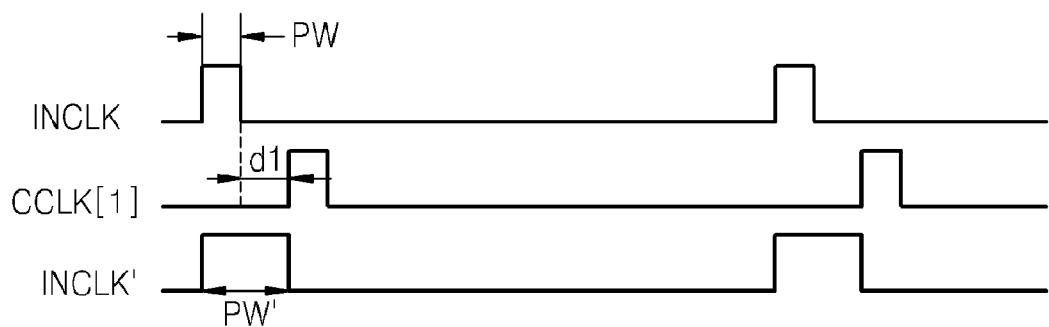
FIG. 9 illustrates an operation of a pulse width adjuster of FIG. 3.

FIG. 9 illustrates an operation of the pulse width adjuster 160 of FIG. 3. Referring to FIG. 9, a pulse width PW of the input clock INCLK is increased by a first delay time d1 at which the first comparison clock CCLK[1] is delayed by the delay unit 140, so that the first comparison clock CCLK[1] may be generated as an adjusted input clock INCLK'. The first delay time d1 may be a difference in delays between the input clock INCLK and the first comparison clock CCLK[1].

In other words, a pulse width PW' of the adjusted input clock INCLK' is larger than the pulse width PW of the input clock INCLK by the first delay time d1. The first delay time d1 may be time from a falling edge of the input clock INCLK to a rising edge of the delayed first comparison clock CCLK[1].

Figure 10A:
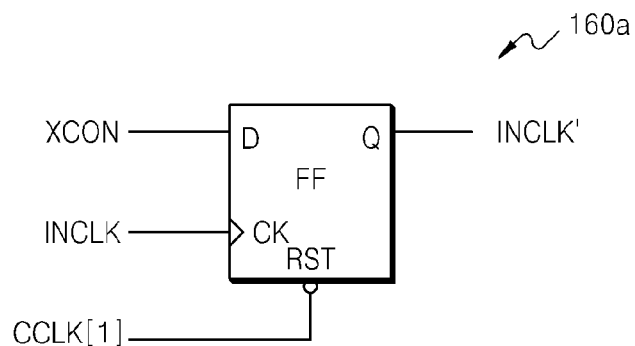
FIGS. 10A through 10G respectively show the pulse width adjuster of FIG. 3, according to other exemplary embodiments.

FIGS. 10A through 10G respectively show the pulse width adjuster 160 of FIG. 3, according to other exemplary embodiments. Referring to FIG. 10A, a pulse width adjuster 160a according to an exemplary embodiment may include a flip-flop FF. The flip-flop FF receives an input clock INCLK at a clock terminal CK, receives a first comparison clock CCLK[1] at a reset terminal RST and outputs an adjusted input clock INCLK' that is activated at a rising edge of the input clock INCLK and deactivated at the rising edge of the first comparison block CCLK[1].

Figure 10B:
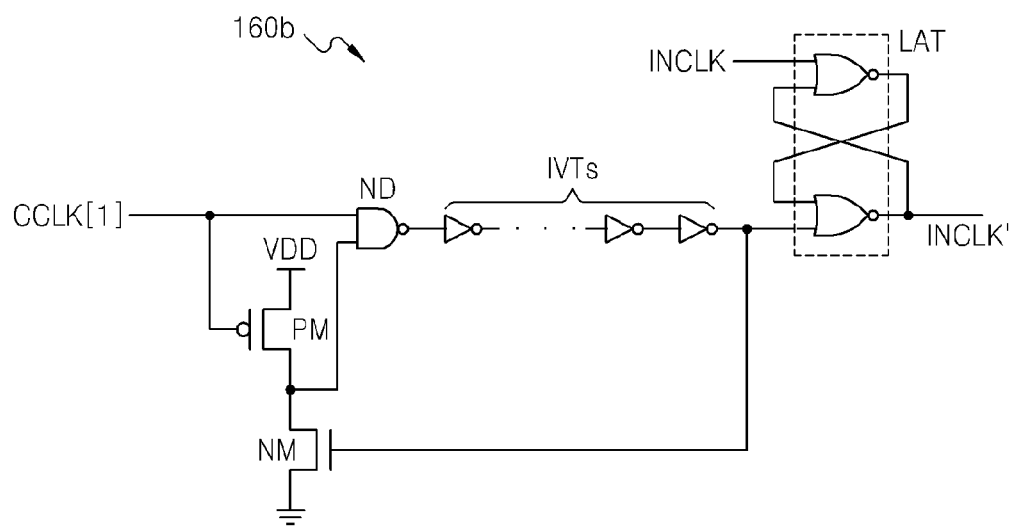

Referring to FIG. 10B, a pulse width adjuster 160b according to another exemplary embodiment may include a PMOS transistor PM and an NMOS transistor NM, which are connected to each other in series between the power supply voltage VDD and the ground voltage VSS. A first comparison clock CCLK[1] is applied to a gate of the PMOS transistor PM, and an end of PMOS transistor PM that is connected to the NMOS transistor NM is also connected to a NAND gate ND. In the NAND gate, an NAND operation is performed on the first comparison clock CCLK[1] and a voltage that is generated at an end of the NMOS transistor NM, and the result of the NAND operation is output by the NAND gate. The output of the NAND gate ND is delayed by an inverter terminal IVTs including a plurality of inverters and is input to an end of a set-reset (SR) latch LAT. Also, an output of the inverter terminal IVTs is connected to the gate of the NMOS transistor NM. The input clock INCLK is input to the other end of the SR latch LAT. Thus, the SR latch LAT outputs an adjusted input clock INCLK' that is activated at the rising edge of the input clock INCLK and deactivated at the rising edge of the first comparison clock CCLK[1].

Figure 10C:
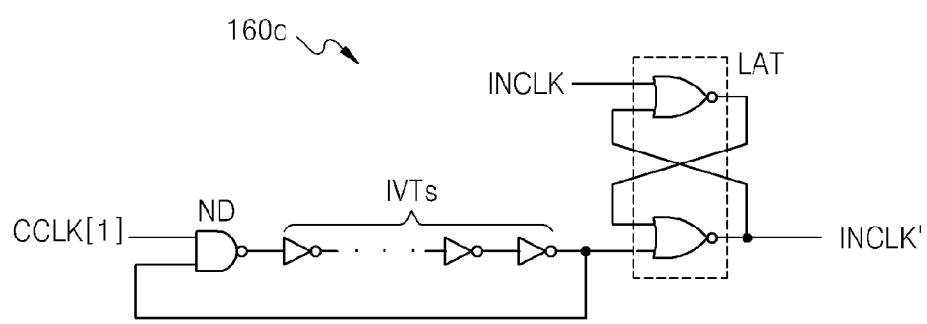

Referring to FIG. 10C, a pulse width adjuster 160c according to another exemplary embodiment is similar to the pulse width adjuster 160b of FIG. 10B. The only difference between FIGS. 10B and 10C is that there is no PMOS transistor PM connected to the NAND gate ND and no NMOS transistor NM connected to the output of the inverter terminal IVTs, and the output of the inverter terminal IVTs is fed back and is applied to the NAND gate ND. Thus, in the NAND gate ND, a NAND operation is performed on the first comparison clock CCLK[1] and the output of the inverter terminal IVTs, and the result of the NAND operation is applied to the inverter terminal IVTs. Similarly, an SR latch LAT of the pulse width adjuster 160c of FIG. 10C outputs an adjusted input clock INCLK' that is activated at the rising edge of the input clock INCLK and deactivated at the rising edge of the first comparison clock CCLK[1].

Figure 10D:
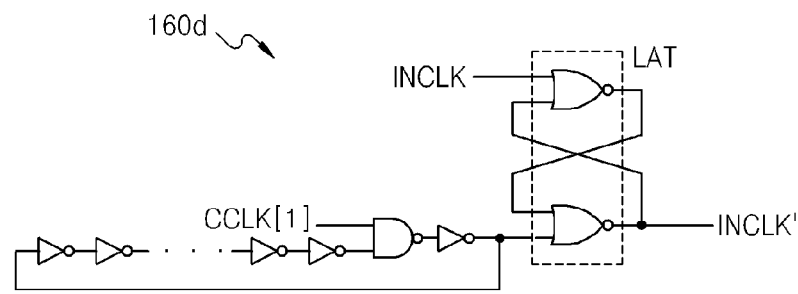

Referring to FIG. 10D, a pulse width adjuster 160d according to another exemplary embodiment has a similar structure to the pulse width adjuster 160c of FIG. 10C. The only difference between FIGS. 10C and 10D is that the inverter terminal IVTs is not connected to the output of the NAND gate ND but is connected to the input of the NAND gate ND. In the NAND gate ND, a NAND operation is performed on the first comparison clock CCLK[1] and the output of the inverter terminal IVTs, and the result of the NAND operation is applied to an end of an SR latch LAT. Similarly, the SR latch LAT of the pulse width adjuster 160d of FIG. 10D outputs an adjusted input clock INCLK' that is activated at the rising edge of the input clock INCLK and deactivated at the rising edge of the first comparison clock CCLK[1].

Figure 10E:
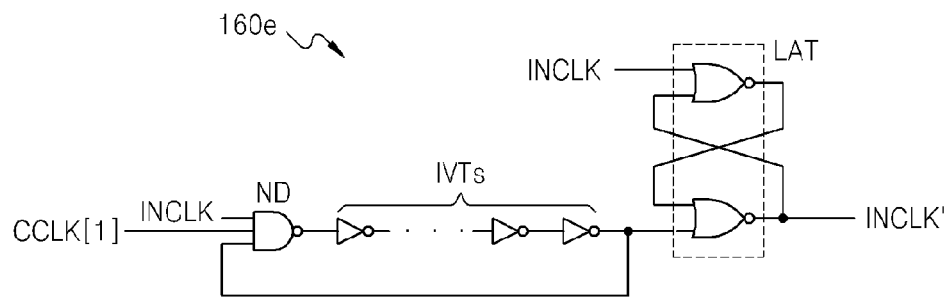

Referring to FIG. 10E, a pulse width adjuster 160e according to another exemplary embodiment is the same as the pulse width adjuster 160c of FIG. 10C except that the input clock INCLK is added to the input of the NAND gate ND.

Figure 10F:
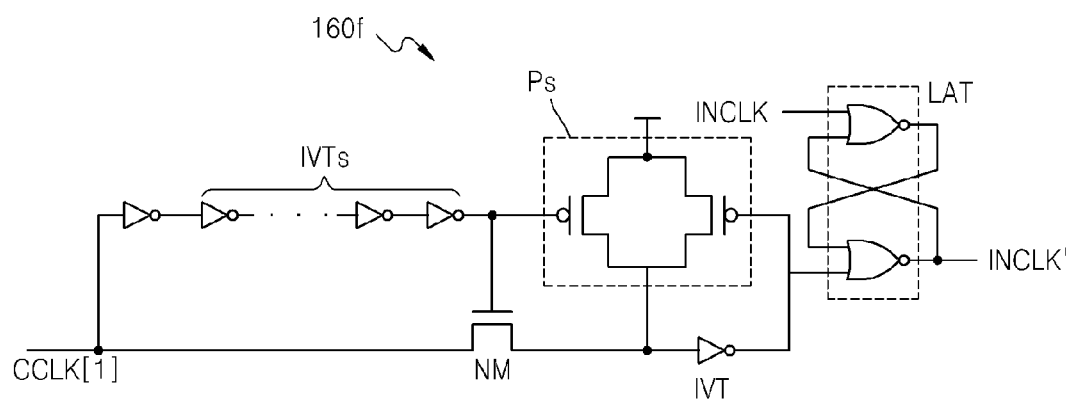

Referring to FIG. 10F, a pulse width adjuster 160f according to another exemplary embodiment includes an NMOS transistor NM that is gated to an output of an inverter terminal IVTs and has an end connected to the first comparison clock CCLK[1], PMOS transistors Ps each having a gate connected to the output of the inverter terminal IVTs. The gate of one of the PMOS transistors Ps is connected to a first input terminal of an SR latch LAT. One end of each of the PMOS transistors PS is connected to a power supply voltage and the other end of each of the PMOS transistors PS is connected to the NMOS transistor NM. A voltage level of an end of each of the PMOS transistors Ps is inverted and is input to the first input terminal of the SR latch LAT and the input clock INCLK is input to a second input terminal of the SR latch LAT.

Figure 10G:
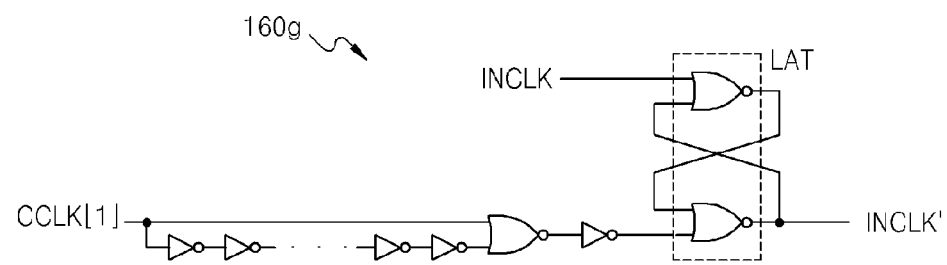

Referring to FIG. 10G, a pulse width adjuster 160g according to another exemplary embodiment uses a NOR gate instead of the NAND gate ND. The number of inverters of the pulse width adjuster 160g of FIG. 10G may be adjusted so that the pulse width adjuster 160g of FIG. 10G may operate in the same manner as the pulse width adjuster 160c of FIG. 10C.

The above-described pulse width adjusters 160a to 160g of FIGS. 10A through 10G receive the input clock INCLK and the first comparison clock CCLK[1] to generate the adjusted input clock INCLK' that is activated at the rising edge of the input clock INCLK and deactivated at the rising edge of the first comparison clock CCLK[1]. As such, the pulse width PW' of the adjusted input clock INCLK' is larger than the pulse width PW of the input clock INCLK by the first delay time d1, as illustrated in FIG. 9. However, the exemplary embodiment is not limited thereto, and the pulse width PW of the input clock INCLK may be increased by a delay time with respect to other comparison clocks. Also, the pulse width adjusters 160a to 160g do not need to include a large number of inverters for delay required to adjust the pulse width PW of the input clock INCLK so that the area of layout of the semiconductor device may be reduced.

Figure 11:
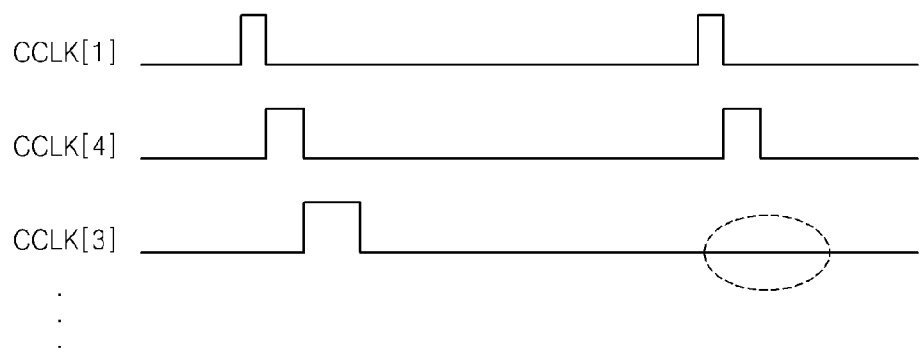
FIG. 11 is a view for explaining a problem that occurs in a DLL circuit having a small delay range.
Figure 11:
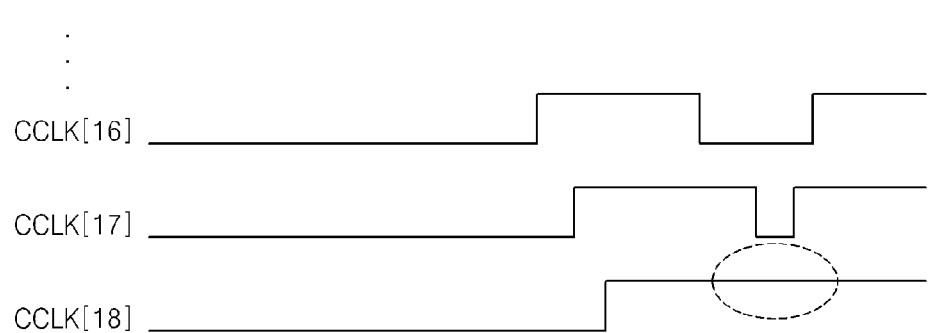

FIG. 11 is a diagram for explaining a problem that occurs in a DLL circuit having a small delay range. Referring to FIG. 11, when the delay range of the DLL circuit 100 of FIG. 1 is small, the pulse of the third comparison pulse CCLK[3] may disappear (see a dotted line of (a) of FIG. 11) or a deactivation time period of the eighteenth comparison pulse CCLK[18] may disappear (see a dotted line of (b) of FIG. 11) so that fail may occur. A problem concerning (a) of FIG. 11 may occur in a high-speed device (control signal XCON="H"), and a problem concerning (b) of FIG. 11 may occur in a low-speed device (control signal XCON="L").

However, the adjusted input clock INCLK' having the adjusted pulse width of the input clock INCLK is delayed to generate comparison clocks CCLK so that the delay range of the DLL circuit 100 of FIG. 1 may be increased. Thus, the problem concerning (a) or (b) of FIG. 11 may be solved.

Figure 12:
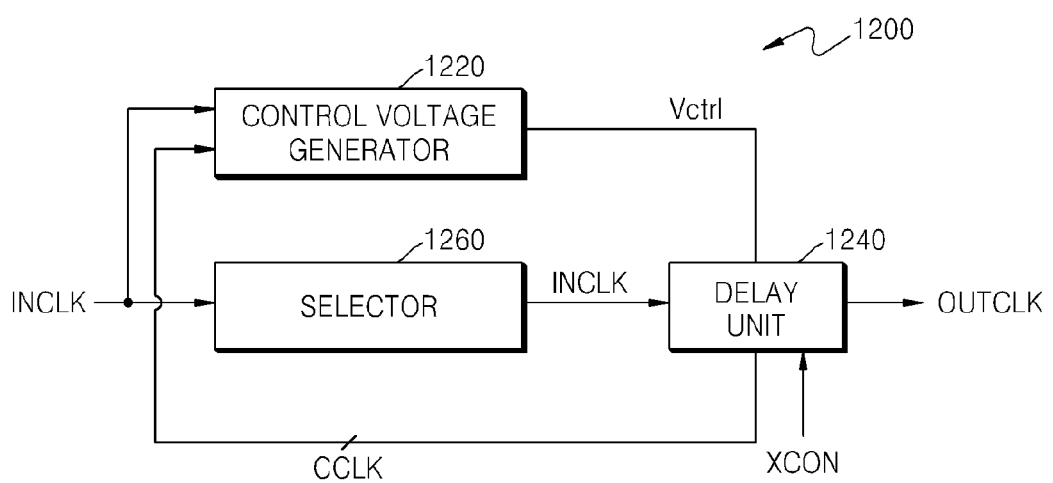
FIG. 12 is a block diagram of a delay-locked loop (DLL) circuit according to another exemplary embodiment.

FIG. 12 is a block diagram of a delay-locked loop (DLL) circuit 1200 according to another exemplary embodiment. Referring to FIG. 12, the DLL circuit 1200 may include a control voltage generator 1220, a delay unit 1240, and a selector 1260, so as to change the phase state of the input clock INCLK into the in-phase state of the comparison clocks CCLK.

The control voltage generator 1220 compares the input clock INCLK with the comparison clocks CCLK to generate a control voltage Vctrl corresponding to a delay difference between the input clock INCLK and the comparison clocks CCLK. The selector 1260 enables one of a plurality of delay lines included in the delay unit 1240. The selector 1260 transmits the input clock INCLK to an enabled delay line. The delay unit 1240 delays the input clock INCLK in response to the control voltage Vctrl applied by the control voltage generator 1220 to generate output clocks OUTCLK.

Figure 13:
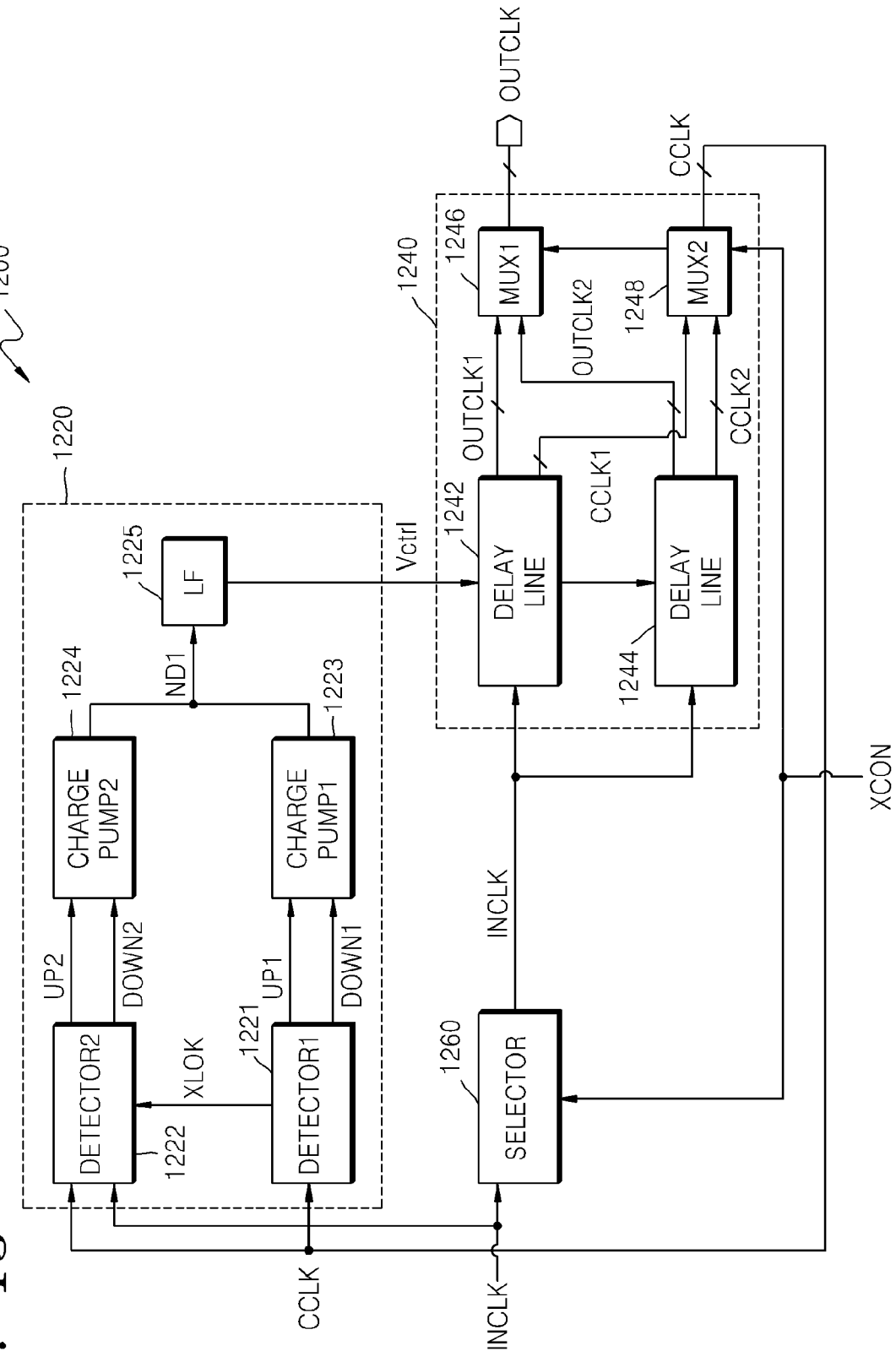
FIG. 13 is a detailed block diagram of the DLL circuit of FIG. 12.

Hereinafter, the structure and operation of the DLL circuit 1200 of FIG. 12 will be described with reference to FIG. 13 in more detail. FIG. 13 is a detailed block diagram of the DLL circuit 1200 of FIG. 1200. The control voltage generator 1220 may include detectors 1221 and 1222, charge pumps 1223 and 1224, and a filter 1225.

The detectors 1221 and 1222 may detect a phase (or delay) difference between the input clock INCLK and the comparison clocks CCLK and may output up signals UP1 and UP2 or down signals DOWN1 and DOWN2 that correspond to the phase difference between the input clock INCLK and the comparison clocks CCLK. The detectors 1221 and 1222 of the control voltage generator 1220 may perform coarse lock and fine lock, respectively, so as to reduce a locking time. A comparison clock CCLK applied to the first detector 1221 and a comparison clock CCLK applied to the second detector 1222 may be different from each other. For example, a fourth comparison clock CCLK4 of FIG. 2 or the like may be applied to the first detector 1221, and a fifteenth comparison clock CCLK15 of FIG. 2 or the like may be applied to the second detector 1222.

The charge pumps 1223 and 1224 may charge electric charges into a first node ND1 or discharge the electric charges from the first node ND1 in response to the up signals UP1 and UP2 or the down signals DOWN1 and DOWN2 that are output by the first and second detectors 1221 and 1222. When the first detector 1221 and the second detector 1222 are provided, as illustrated in FIG. 13, the charge pumps 1223 and 1224 may include a first charge pump 1223 that operates in response to the up signal UP1 and the down signal DOWN1 that are output by the first detector 1221, and a second charge pump 1224 that operates in response to the up signal UP2 and the down signal DOWN2 that are output by the second detector 1222.

The filter 1225 may filter a voltage of the first node ND1 to output the filtered voltage of the first node ND1 as the control voltage Vctrl. The filter 1225 of FIG. 13 may be a low pass filter, in particular.

The control voltage Vctrl output by the control voltage generator 1220 is applied to the delay unit 1240. The delay unit 1240 may include delay lines 1242 and 1244 that delay the adjusted input clock INCLK applied by the selector 160 by time corresponding to the control voltage Vctrl. The adjusted input clock INCLK may be delayed by the delay lines 1242 and 1244 and may be output as the comparison clocks CCLK and the output clocks OUTCLK.

The delay lines 1242 and 1244 may include the first delay line 1242 and the second delay line 1244. One of the first delay line 1242 and the second delay line 1244 is activated in response to a control signal XCON (see FIG. 12). Although not shown, a unit for activating the first delay line 1242 or the second delay line 1424 according to a logic level of the control signal XCON, such as a switch, a transistor or the like, may be further included.

The control signal XCON may indicate whether the semiconductor device in which the DLL circuit 1200 of FIG. 1200 is installed operates with a high frequency. For example, when the semiconductor device operates with the high frequency, the control signal XCON may be set to logic high "H", and the first delay line 1242 may be activated in response to the control signal XCON. On the other hand, when the semiconductor device does not operate with the high frequency, the control signal XCON may be set to logic low "L", and the second delay line 1244 may be activated in response to the control signal XCON.

When data of the semiconductor device is processed in units of 8 bits, if the semiconductor device operates in the frequency range of 265 to 465 Mhz, the semiconductor device may operate with a high frequency. Also, when data of the semiconductor device is processed in units of 6 bits, if the semiconductor device operates in the frequency range of 159 to 445 Mhz, the semiconductor device may operate with a high frequency.

Figure 14:
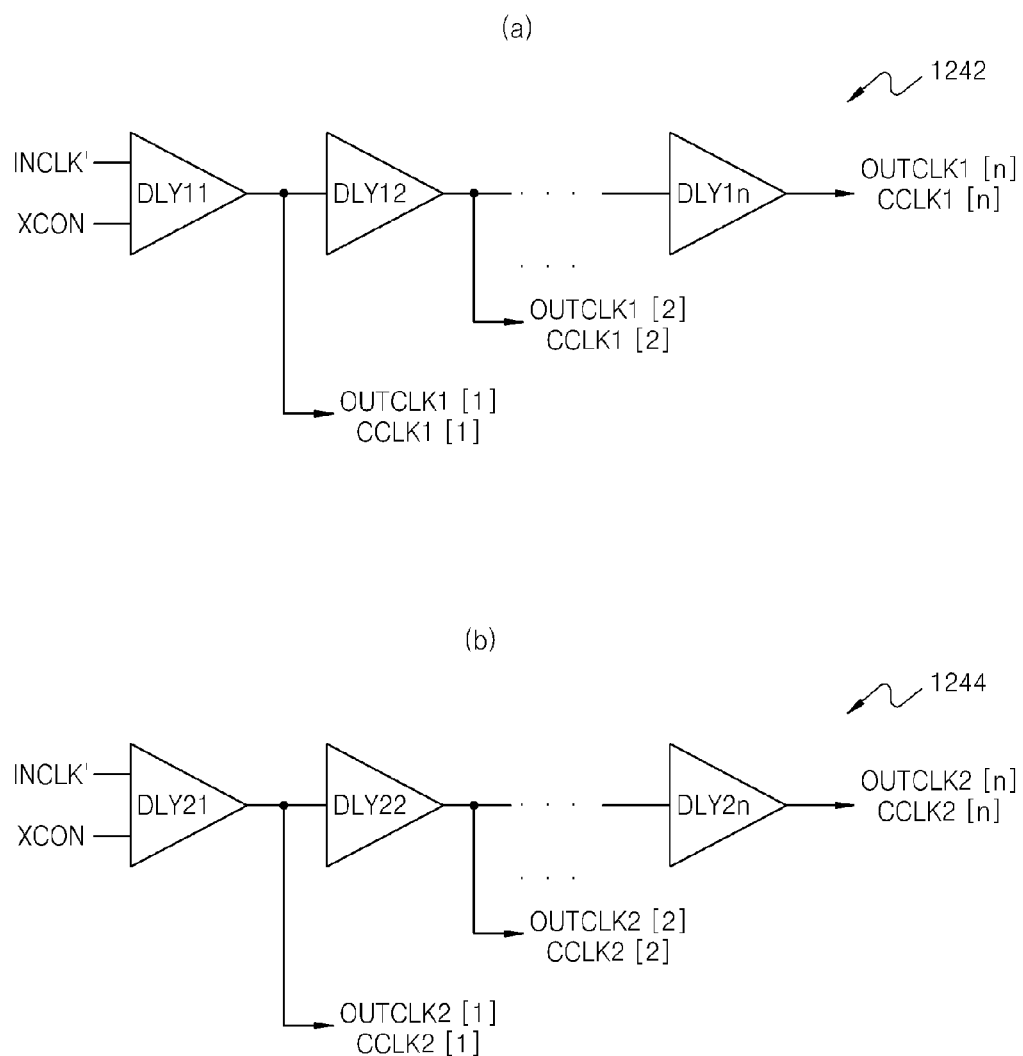
FIGS. 14A and 14B are detailed diagrams of first and second delay lines of the DLL circuit of FIG. 13.

FIGS. 14A and 14B are detailed diagrams of first and second delay lines of the DLL circuit of FIG. 13. Referring to FIG. 14A, which is a detailed diagram of the first delay line 1242 of FIG. 13, the first delay line 1242 may include a plurality of delayers DLY11, DLY12, ..., and DLY1n that are connected to one another in series. The number of the delayers DLY11, DLY12, ..., and DLY1n of the first delay line 1242 may be the number n of comparison clocks CCLK1. In other words, the delayers DLY11, DLY12, ..., and DLY1n of the first delay line 1242 may output comparison clocks CCLK1 of a plurality of comparison clocks CCLK1 having different delays, respectively. For example, the first delayer DLY11 of the first delay line 1242 may output a first comparison clock CCLK1[1], and the second delayer DLY12 of the first delay line 1242 may output a second comparison clock CCLK1[2], and a n-th delayer DLY1n of the first delay line 1242 may output a n-th comparison clock CCLK1[n].

Similarly, the delayers DLY11, DLY12, ..., and DLY1n of the first delay line 1242 may output clocks OUTCLK1 of a plurality of output clocks OUTCLK1 having different delays, respectively. For example, the first delayer DLY11 of the first delay line 1242 may output a first output clock OUTCLK1[1], and the second delayer DLY12 of the first delay line 1242 may output a second output OUTCLK1[2], and a n-th delayer DLY1n of the first delay line 1242 may output a n-th output clock OUTCLK1[n].

Referring to FIG. 14B, which is a detailed diagram of the second delay line 1244 of FIG. 13, the first delay line 1244 may include a plurality of delayers DLY21, DLY22, ..., and DLY2n that are connected to one another in series, like the first delay line 1242. In other words, the number of the delayers DLY21, DLY22, ..., and DLY2n of the second delay line 144 may be the number n of comparison clocks CCLK2. In other words, the delayers DLY21, DLY22, ..., and DLY2n of the second delay line 1244 may output comparison clocks CCLK2 of a plurality of comparison clocks CCLK2 having different delays, respectively. For example, the first delayer DLY21 of the second delay line 1244 may output a first comparison clock CCLK2[1], and the second delayer DLY22 of the second delay line 1244 may output a second comparison clock CCLK1[2], and a n-th delayer DLY2n of the second delay line 1244 may output a n-th comparison clock CCLK2[n].

Similarly, the delayers DLY21, DLY22, ..., and DLY2n of the second delay line 144 may output clocks OUTCLK2 of a plurality of output clocks OUTCLK2 having different delays, respectively. For example, the first delayer DLY21 of the second delay line 1244 may output a first output clock OUTCLK2[1], and the second delayer DLY22 of the second delay line 1244 may output a second output OUTCLK2[2], and a n-th delayer DLY2n of the second delay line 1244 may output a n-th output clock OUTCLK2[n].

The number of delayers DLY21, DLY22, ..., and DLY2n of the second delay line 1244 that is activated in a low-speed device may be greater than that of the delayers DLY11, DLY12, ..., and DLY1n of the first delay line 1242. A difference between the delayers of the first and second delay lines 142 and 144 will be described later.

Figure 15:
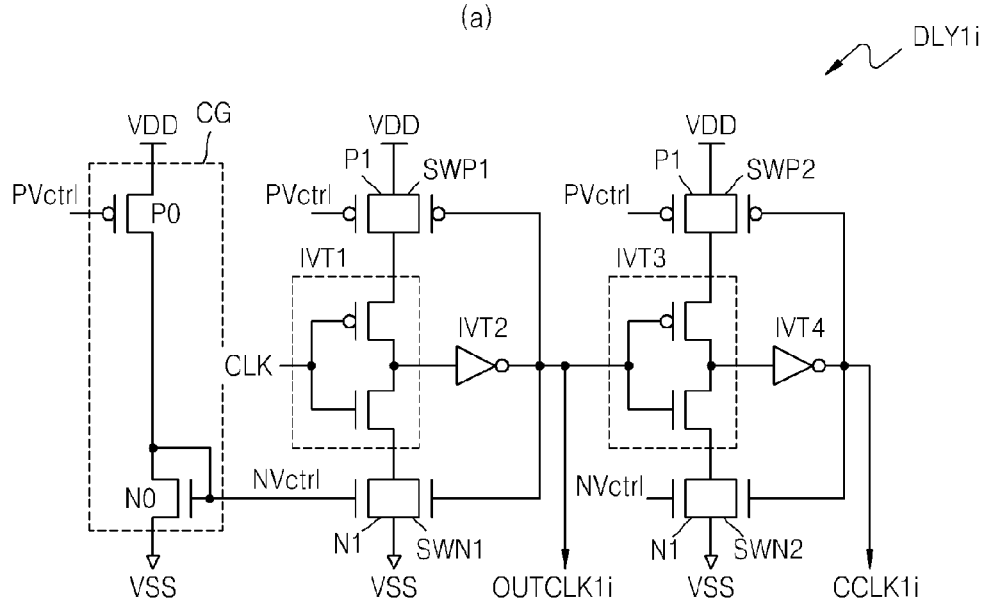
FIGS. 15A and 15B show delayers of FIGS. 14A and 14B, according to an exemplary embodiment.
Figure 15:
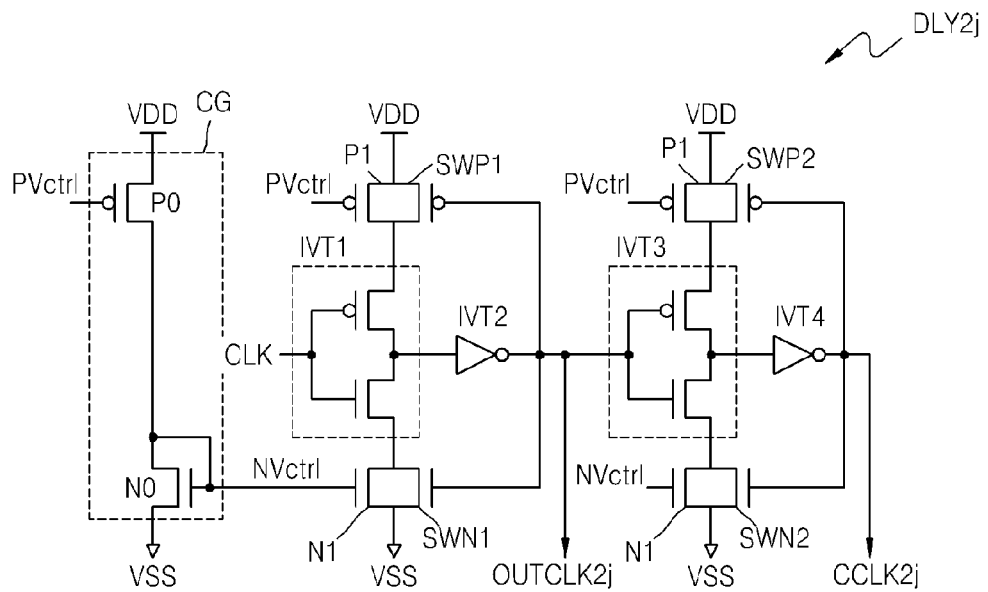

Referring to FIGS. 15A and 15B, comparison clocks and output clocks of the first delay line 1242 are represented by CCLK1[i] and OUTCLK1[i], respectively, and comparison clocks and output clocks of the second delay line 1244 that is generated by the low-speed device are represented by CCLK2[i] and OUTCLK2[i], respectively, in order to classify the comparison clocks and the output clocks of the first delay line 1242 that is generated by a high-speed device. Also, delayers of the first delay line 1242 are represented by DLY1i, and delayers of the second delay line 1244 are represented by DLY2i. This also applies to the following description.

FIG. 15A is a circuit diagram of delayers of FIG. 14A, according to an exemplary embodiment. Referring to FIG. 15A, each of the delayers DLY1i of the first delay line 1242 may include inverters IVT1 to 1VT4, first current generators P1 and second current generators N1, first switches SWP1 and SWP2 which are connected between the first current generators P1 and the power supply voltage VDD, and second switches SWN1 and SWN2 which are connected between the second current generators N1 and the ground voltage VSS.

The first inverter 1VT1 that is placed at a first end of each delayer DLY1i of the first delay line 1242 inverts an output clock CLK of a delayer that is placed at the front end of the delayer DLY1i including the first inverter IVT1, among the plurality of delayers DLY11, DLY12, ..., and DLY1n that are connected to one another in series and constitute the first delay line 1242 of FIG. 14A, and the first inverter IVT1 performs a delay operation. The first inverter IVT1 of the first delayer DLY11 of the first delay line 1242 inverts an adjusted input clock INCLK.

The second through fourth inverters IVT2, IVT3, and IVT4 invert an output of an inverter that is connected to the front end of the delayer DLY1i and performs a delay operation.

The delayer DLY1i of FIG. 15A may output the adjusted input clock INCLK that is delayed by the first inverter IVT1 and the second inverter IVT2 as an output clock OUTCLK1i and may delay the output clock OUTCLK1i via the third inverter IVT3 and the fourth inverter IVT4 and output a comparison clock CCLK1i. The exemplary embodiment is not limited thereto, and the output clock OUTCLK1i may be delayed more than the comparison clock CCLK1i and may be output.

Each of the first switches SWP1, SWP2 and the second switches SWN1, SWN2 switch the corresponding first current generators P1 and second current generators N1 respectively. Each of the first current generators P1 and the second current generators N1 may be on or off due to the control voltage Vctrl and may adjust a delay due to the inverters IVT1 to IVT4 connected to the first current generators P1 and the second current generators N1, directly or indirectly. The first current generators P1 may supply current that corresponds to a difference between the power supply voltage VDD and the control voltage Vctrl to the inverters IVT1 to IVT4, thereby adjusting delays of the inverters IVT1 to IVT4. Also, the second current generators N1 may discharge the current that corresponds to a difference between the ground voltage VSS and the control voltage Vctrl from the inverters IVT1 to IVT4, thereby adjusting delays of the inverters IVT1 to IVT4.

Specifically, when a difference between a control voltage PVctrl applied to the first current generators P1 and the power supply voltage VDD is small, a large magnitude of current is supplied to the inverters IVT1 to IVT4, and the operating speed of each of the inverters IVT1 to IVT4 may be increased. Thus, delays caused by the inverters IVT1 to IVT4 may be decreased. On the other hand, when the difference between the control voltage PVctrl applied to the first current generators P1 and the power supply voltage VDD is large, a small magnitude of current is supplied to the inverters IVT1 to IVT4, and the operating speed of each of the inverters IVT1 to IVT4 may be decreased. Thus, delays caused by the inverters IVT1 to IVT4 may be increased.

Similarly, when a difference between a control voltage NVctrl applied to the second current generators N1 and the power supply voltage VDD is large, a large magnitude of current is discharged from the inverters IVT1 to IVT4, and the operating speed of each of the inverters IVT1 to IVT4 may be increased. Thus, delays caused by the inverters IVT1 to IVT4 may be decreased. On the other hand, when the difference between the control voltage NVctrl applied to the second current generators N1 and the power supply voltage VDD is small, a small magnitude of current is discharged from the inverters IVT1 to IVT4, and the operating speed of each of the inverters IVT1 to IVT4 may be decreased. Thus, delays caused by the inverters IVT1 to IVT4 may be increased.

Each of the first current generators P1 may be PMOS transistors that are connected to the power supply voltage VDD and the inverters IVT1 or IVT3, and gated by the control voltage PVctrl. The control voltage PVctrl may be the control voltage Vctrl which is transmitted through the PMOS transistor P0 to the first current generators P1. Each of the second current generators N1 may be NMOS transistors that are connected to the ground voltage VSS and the inverters IVT1 or IVT3, and gated by the control voltage NVctrl. The control voltage NVctrl may be the control voltage Vctrl which is transmitted through the NMOS transistor N0 to the second current generators N1. The exemplary embodiment is not limited thereto, and the first current generators P1 may be NMOS transistors or the second current generators N1 may be PMOS transistors.

Each of the first switches SWP1, SWP2 may be PMOS transistors. Each of the sources of the PMOS transistors of the first switches SWP1, SWP2 are shared with the corresponding sources of the PMOS transistors of the first current generators P1. Each of the drains of the PMOS transistors of the first switches SWP1, SWP2 are shared with the corresponding drains of the PMOS transistors of the first current generators P1. Also, each of the gates of the PMOS transistors of the first switches SWP1, SWP2 is connected to an output of the corresponding inverters. Each of the corresponding inverters is connected to an output of an inverter that is connected to the source or the drain of the PMOS transistors of the first switches SWP1, SWP2. For example, each of the source and the drain of the PMOS transistor of the first switch SWP1 is connected to the source and the drain of the PMOS transistor of the first current generator P1. Also, the gate of the PMOS transistor of the first switch SWP1 is connected to the output of the inverter IVT2, which is connected to the output of the inverter IVT1.

Each of the second switches SWN1, SWN2 may be NMOS transistors. Each of the sources of the NMOS transistors of the second switches SWN1, SWN2 are shared with the corresponding sources of the NMOS transistors of the second current generators N1. Each of the drains of the NMOS transistors of the second switches SWN1, SWN2 are shared with the corresponding drains of the NMOS transistors of the second current generators N1. Also, each of the gates of the NMOS transistors of the second switches SWN1, SWN2 is connected to an output of the corresponding inverters. Each of the corresponding inverters is connected to an output of an inverter that is connected to the source or the drain of the NMOS transistors of the second switches SWN1, SWN2. For example, each of the source and the drain of the NMOS transistor of the second switch SWN1 is connected to the source and the drain of the NMOS transistor of the second current generator N1. Also, the gate of the NMOS transistor of the second switch SWN1 is connected to the output of the inverter IVT2, which is connected to the output of the inverter IVT1.

Each of the first switches SWP1, SWP2 switches on and off the first current generators P1. Also, each of the second switches SWN1, SWN2 switches on and off the second current generators N1. Therefore, the delay lines 1242 and 1244 of FIG. 13 can get a margin of drain-to-source voltage of the transistors. In other words, because some transistors that supplied the current to the inverters of the delay lines 1242 and 1244 of FIG. 13 operate as switches, the delay of the DLL circuit 1200 increases as much as the amount of the margin of drain-to-source voltage of the transistors. Moreover, as each of the first switches SWP1, SWP2 and the second switches SWN1, SWN2 is connected to the outputs of the next stage inverters of the connected inverters, slewing at the rising/falling edges can be prevented.

Referring to FIG. 15B, which is a circuit diagram of the delayers of FIG. 14B, according to an exemplary embodiment, each of delayers DLY2$j$ (where j is a natural number that is less than or equal to n) have the same structure as that of each of the delayers DLY1$i$ of FIG. 15B. The size of each of the first current generators P1 and the second current generators N1 of the delayers DLY2$j$ of FIG. 15B may be smaller than each of the first current generators P1 and the second current generators N1 of the delayers DLY1$i$ of FIG. 15A. Thus, delays generated by the delayers DLY2$j$ of FIG. 15B may be longer than those of the delayers DLY1$i$ of FIG. 15A.

Figure 16:
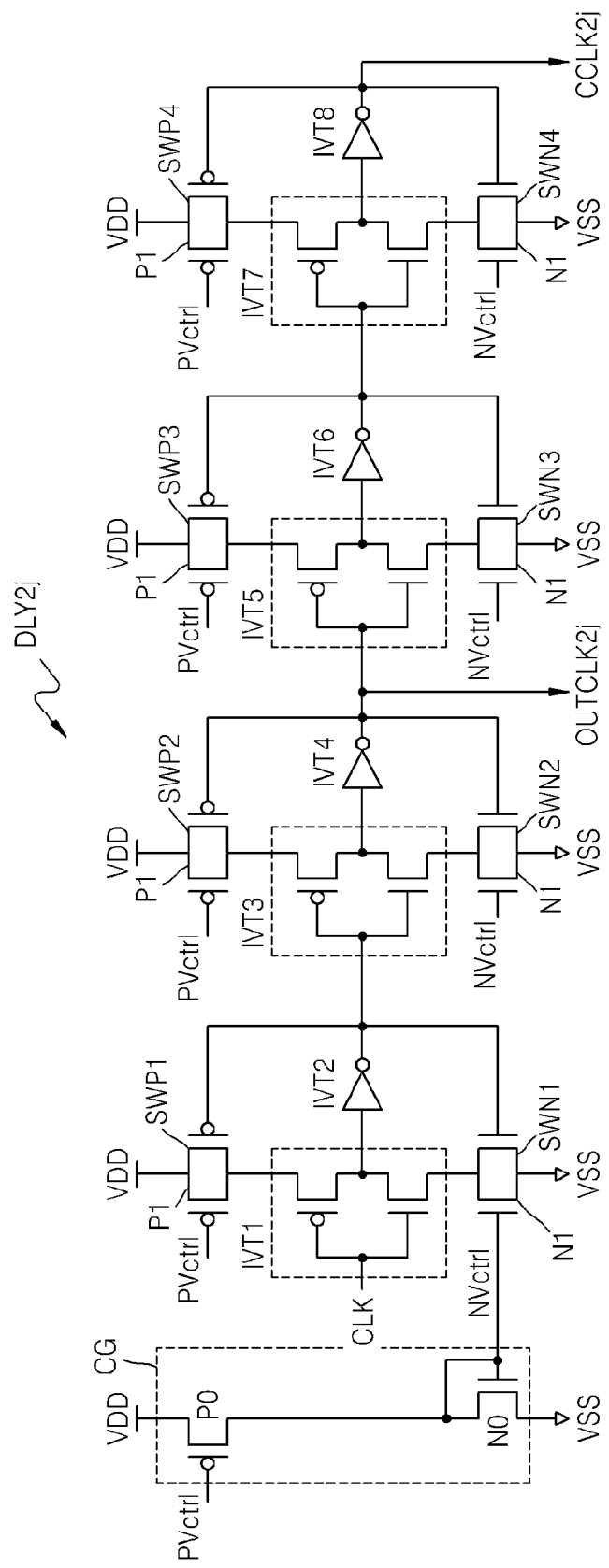
FIG. 16 shows delayers of FIG. 14B, according to another exemplary embodiment.

In this way, each delayer DLY1$i$ of the first delay line 1242 and each delayer DLY2$j$ of the second delay line 1244 include the same number of inverters, and the size of the transistors of the current generators may be varied so that the delayer of the first delay line 1242 and the second delay line 1244 may be varied. However, the exemplary embodiment is not limited thereto. FIG. 16 shows delayers of FIG. 14B, according to another exemplary embodiment. Referring to FIG. 16, each of the delayers DLY2$j$ of the second delay line 1244 may include more inverters and more current generators than inverters and current generators included in each delayer DLY1$i$ of the first delay line 1242 so that a delay generated by the delayer DLY2$j$ of the second delay line 1244 may be longer than a delay generated by the delayer DLY1$i$ of the first delay line 1242.

For example, the delayer DLY1$i$ of the first delay line 1242 is the same as the delayer DLY1$i$ of FIG. 15A. However, the delayer DLY2$j$ of the second delay line 1244 of FIG. 16 may include more inverters IVT1 to IVT8, more first current generators P1 and second current generators N1 that are respectively connected to the inverters IVT1 to IVT8. The size of each of transistors included in current generators of the delayer DLY2$j$ of FIG. 16 may have the same sizes of the transistors included in current generators of the delayer DLY1$i$ of FIG. 15A.

The delayer DLY2$j$ of FIG. 16 may delay an input clock CLK by using four inverters IVT1 to IVT4, which are placed at a relatively front end of the delayer DLY2$j$, to output the delayed input clock CLK as an output clock OUTCLK2$j$ and may delay the output clock OUTCLK2$j$ by using the remaining four inverters IVT5 to IVT8, which are placed at a relatively rear end of the delayer DLY2$j$, to output the delayed output clock OUTCLK2$j$ as a comparison clock CCLK2$j$.

In the above exemplary embodiment, the first and the second current generators and the first and second switches are disposed at both ends of all of odd inverters IVT1 and IVT3 of the delayers of FIGS. 15A and 15B or all of odd inverters IVT1, IVT3, IVT5 and IVT7 the delayers of FIG. 16. However, the exemplary embodiment is not limited thereto. FIGS.

Figure 17:
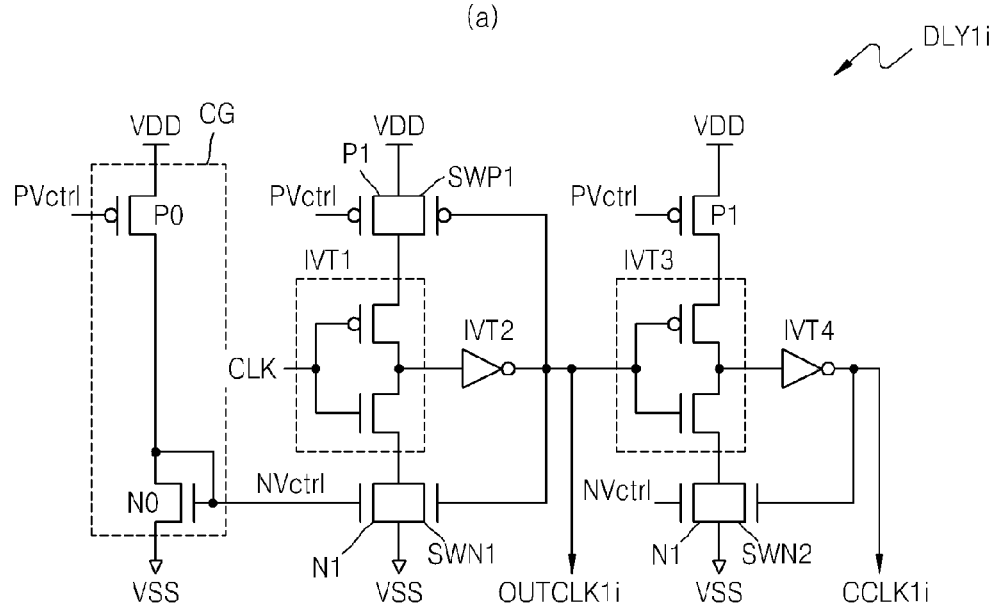
FIGS. 17A and 17B show delayers of FIGS. 14A and 14B, according to another exemplary embodiment.
Figure 17:
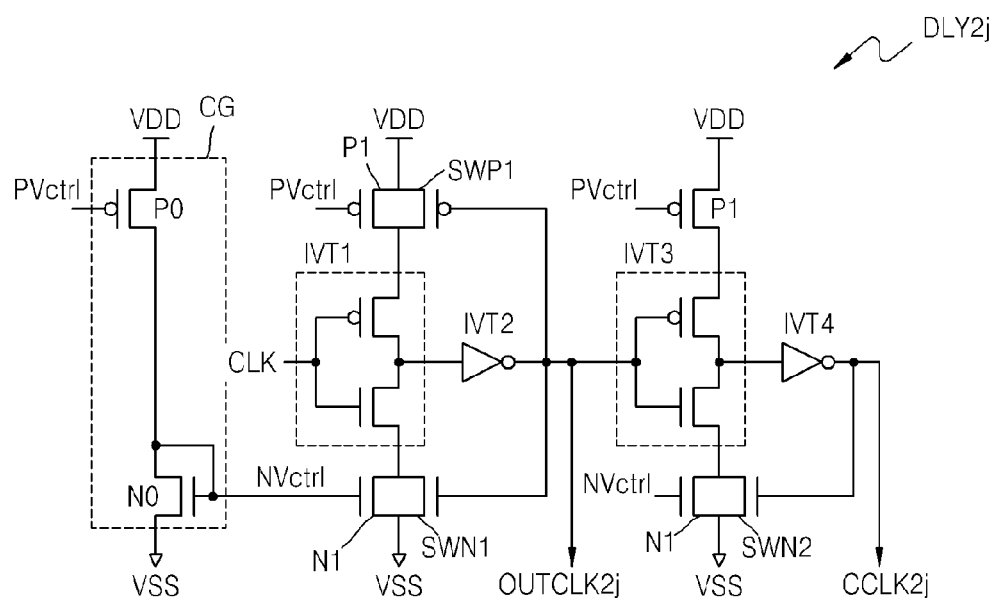

17A and 17B show the delayer DLY1*i* of the first delay line 1242 of FIG. 14A and the delayer DLY2*j* of the second delay line 1244 of FIG. 14B, according to another exemplary embodiment. Referring to FIGS. 17A and 17B, the delayer DLY1*i* of the first delay line 1242 and the delayer DLY2*j* of the second delay line 1244 may include an inverter IVT3 that does not include the first switch SWP1 at their one end.

Figure 18:
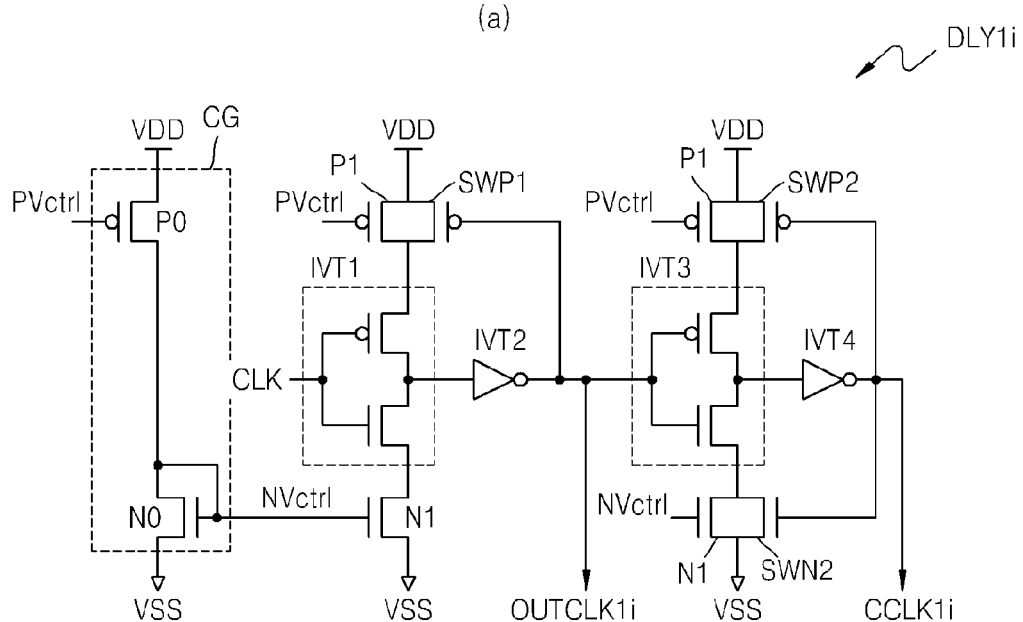
FIGS. 18A and 18B show delayers of FIGS. 14A and 14B, according to another exemplary embodiment.
Figure 18:
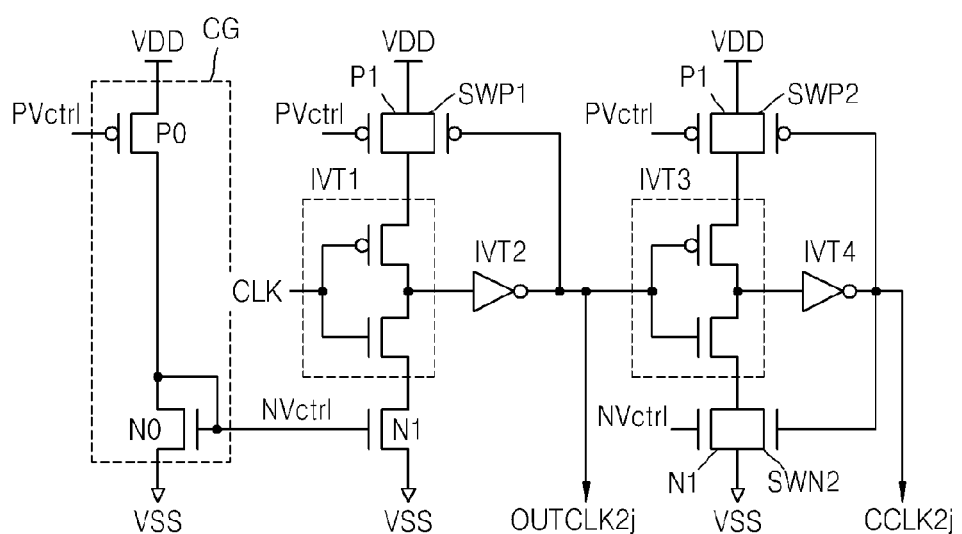

FIGS. 18A and 18B show the delayer DLY1*i* of the first delay line 1242 of FIG. 14A and the delayer DLY2*j* of the second delay line 1244 of FIG. 14B, according to another exemplary embodiment. Referring to FIGS. 18A and 18B, the delayer DLY1*i* of the first delay line 1242 and the delayer DLY2*j* of the second delay line 1244 may include an inverter IVT1 that does not include the second switch SWN1 at their one end.

Figure 19:
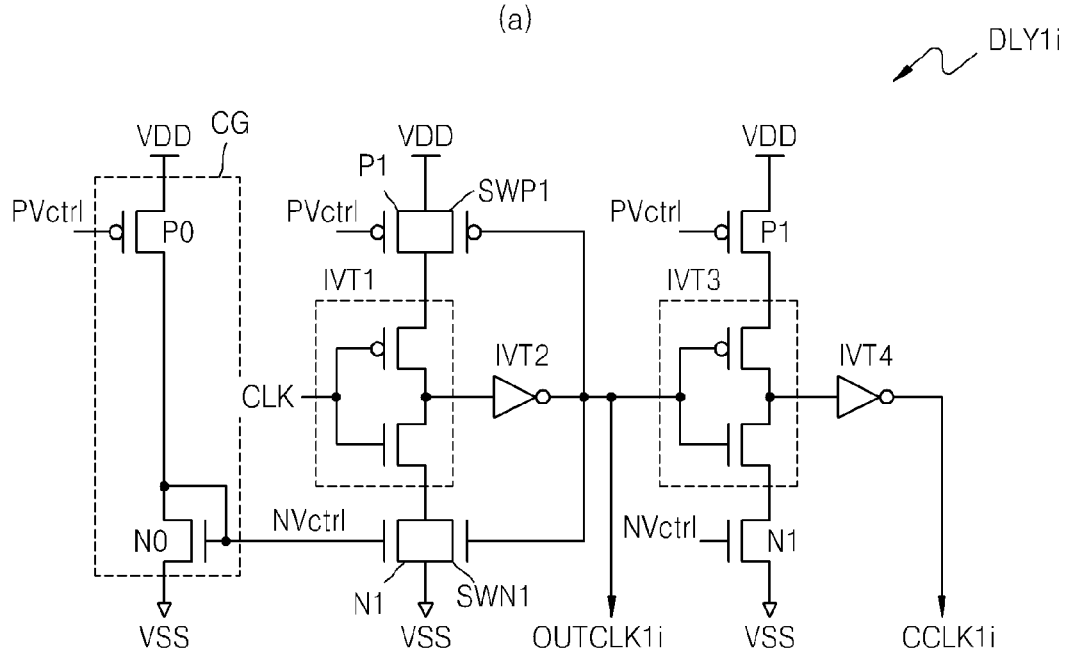
FIGS. 19A and 19B show delayers of FIGS. 14A and 14B, according to another exemplary embodiment.
Figure 19:
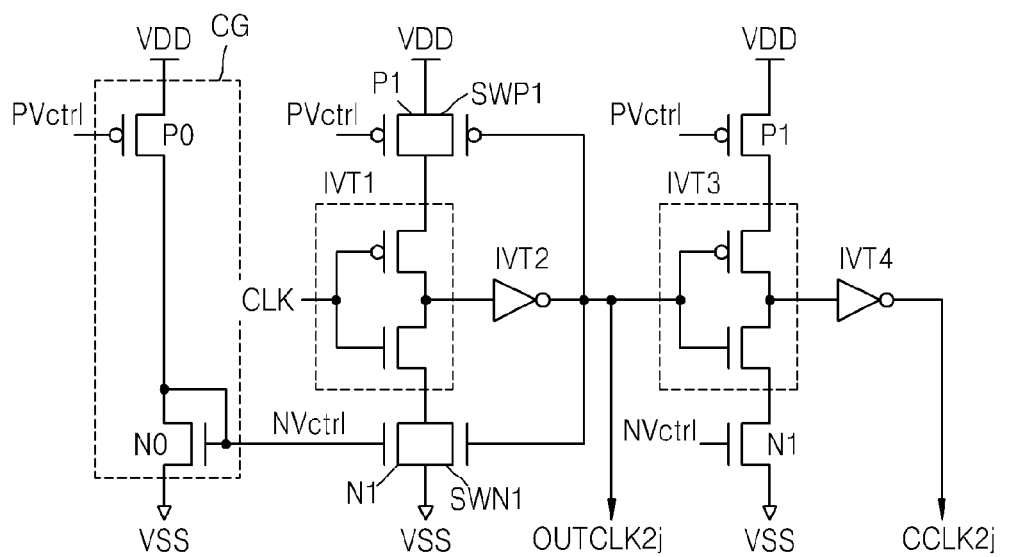

FIGS. 19A and 19B show the delayer DLY1*i* of the first delay line 1242 of FIG. 14A and the delayer DLY2*j* of the second delay line 1244 of FIG. 14B, according to another exemplary embodiment. Referring to FIGS. 19A and 19B, the delayer DLY1*i* of the first delay line 1242 and the delayer DLY2*j* of the second delay line 1244 may include an inverter IVT3 that does not include the first switch SWP1 and the second switch SWN1 at the ends of inverter IVT3.

Figure 20:
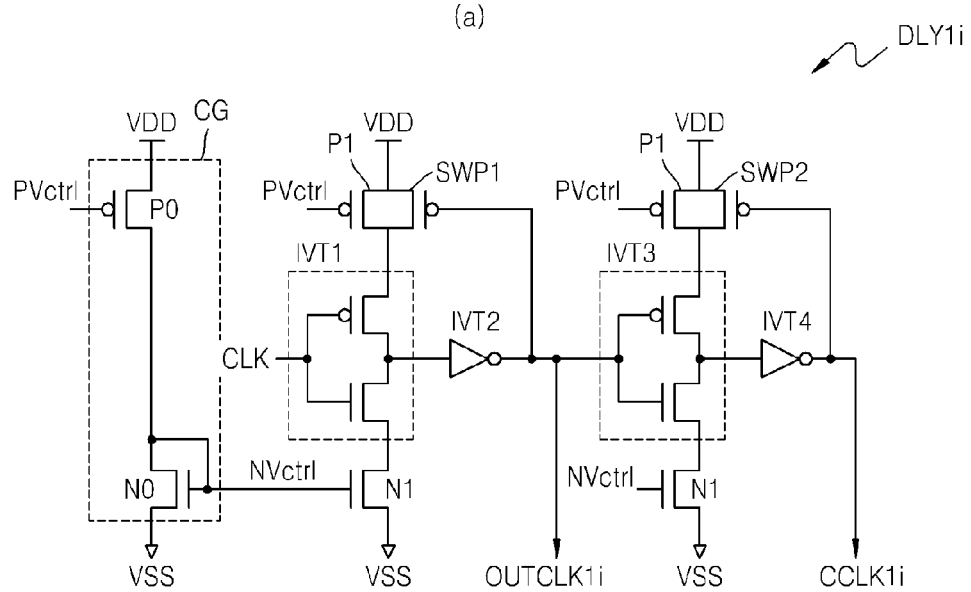
FIGS. 20A and 20B show delayers of FIGS. 14A and 14B, according to another exemplary embodiment.
Figure 20:
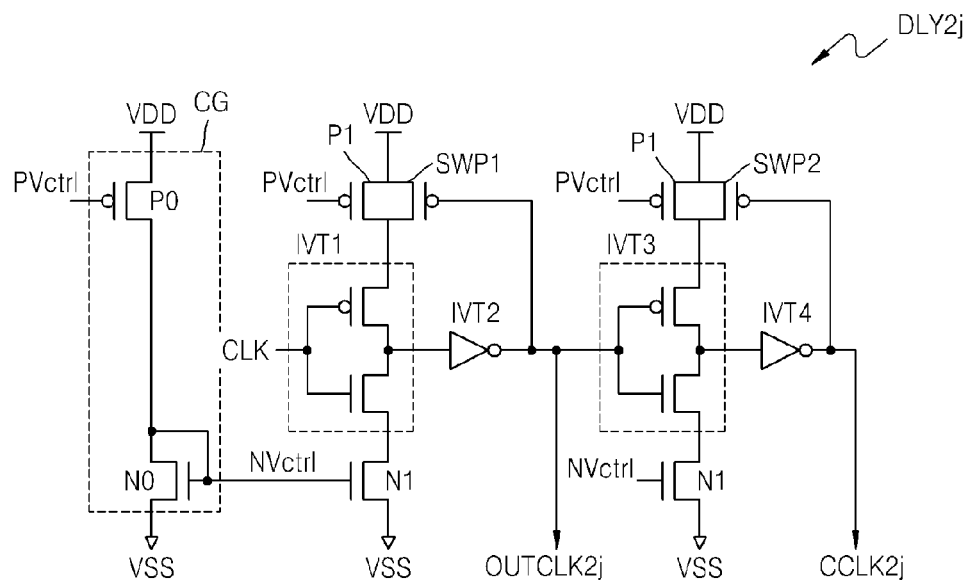

FIGS. 20A and 20B show the delayer DLY1*i* of the first delay line 1242 of FIG. 14A and the delayer DLY2*j* of the second delay line 1244 of FIG. 14B, according to another exemplary embodiment. Referring to FIGS. 20A and 20B, all odd inverters IVT1 and IVT3 of the delayer DLY1*i* of the first delay line 1242 and the delayer DLY2*j* of the second delay line 1244 may include only the first switches SWP1, SWP2.

Figure 21:
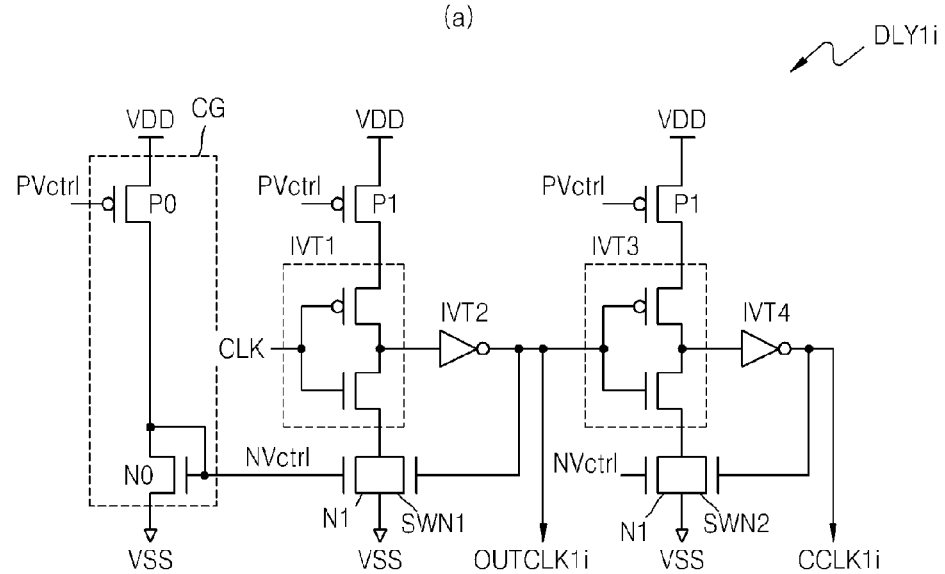
FIGS. 21A and 21B show delayers of FIGS. 14A and 14B, according to another exemplary embodiment.
Figure 21:
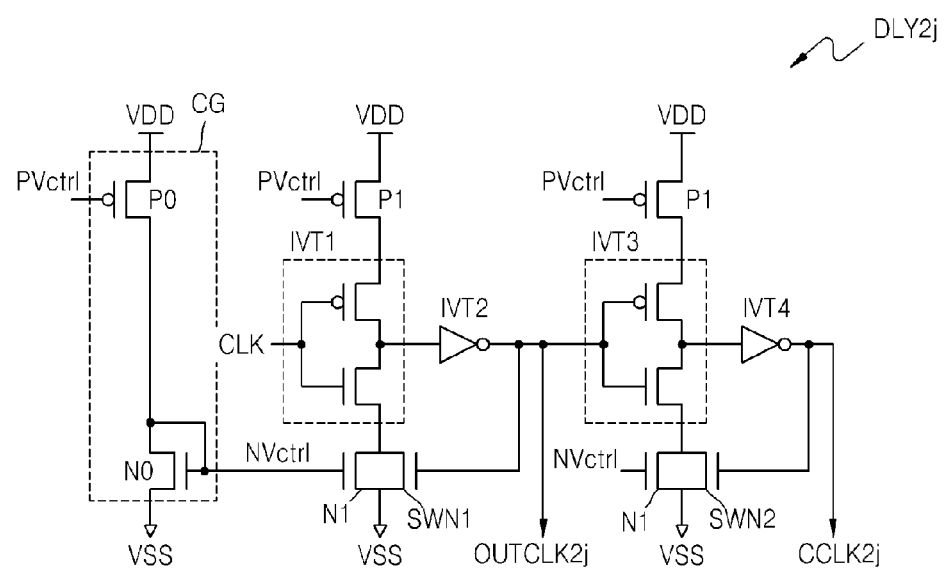

FIGS. 21A and 21B show the delayer DLY1*i* of the first delay line 1242 of FIG. 14A and the delayer DLY2*j* of the second delay line 1244 of FIG. 14B, according to another exemplary embodiment. Referring to FIGS. 21A and 21B, all odd inverters IVT1 and IVT3 of the delayer DLY1*i* of the first delay line 1242 and the delayer DLY2*j* of the second delay line 1244 may include only the second switches SWN1.

Figure 22:
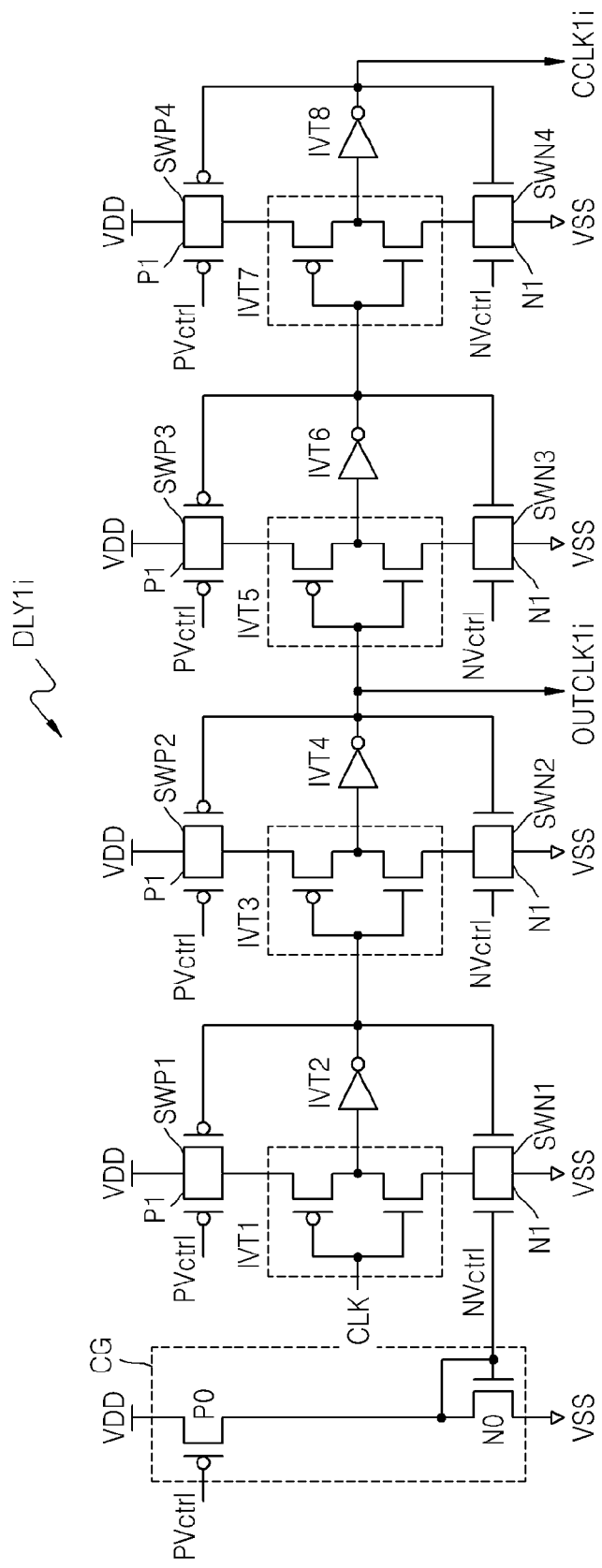
FIG. 22 shows delayers of FIG. 14A, according to another exemplary embodiment.

Also, referring to FIG. 22, the delayer DLY1*i* of the first delay line 1242 has more current generators or switches than the delayer DLY2*j* of the second delay line 1244. Although not shown, the first and the second current generators or the first and second switches are disposed at both ends of even inverters (for example, IVT2 and IVT4).

As above mentioned, according to exemplary embodiments, there may be several types of delayers.

Referring back to FIG. 13, the delayer 1240 may further include a MUX1 1246 and a MUX2 1248. The MUX1 1246 may select output clocks OUTCLK from among output clocks OUTCLK1 output from the first delay line 1242 in response to the control signal XCON and output clocks OUTCLK2 output from the second delay line 1244, and outputs the selected output clocks OUTCLK. The second MUX2 1248 selects comparison clocks CCLK from among comparison clocks CCLK1 output from the first delay line 142 and comparison clocks CCLK2 output from the second delay line 1244.

The output clocks OUTCLK output from the first MUX1 1246 may be applied to other elements of the semiconductor device including the DLL circuit 1200 of FIG. 12. For example, when the semiconductor device is an LCD, the output clocks OUTCLK may be applied to a driver IC. The semiconductor device may perform operations based on the output clocks OUTCLK.

The comparison clocks CCLK output from the second MUX2 1248 may be fed back to the control voltage generator 1220.

Figure 23:
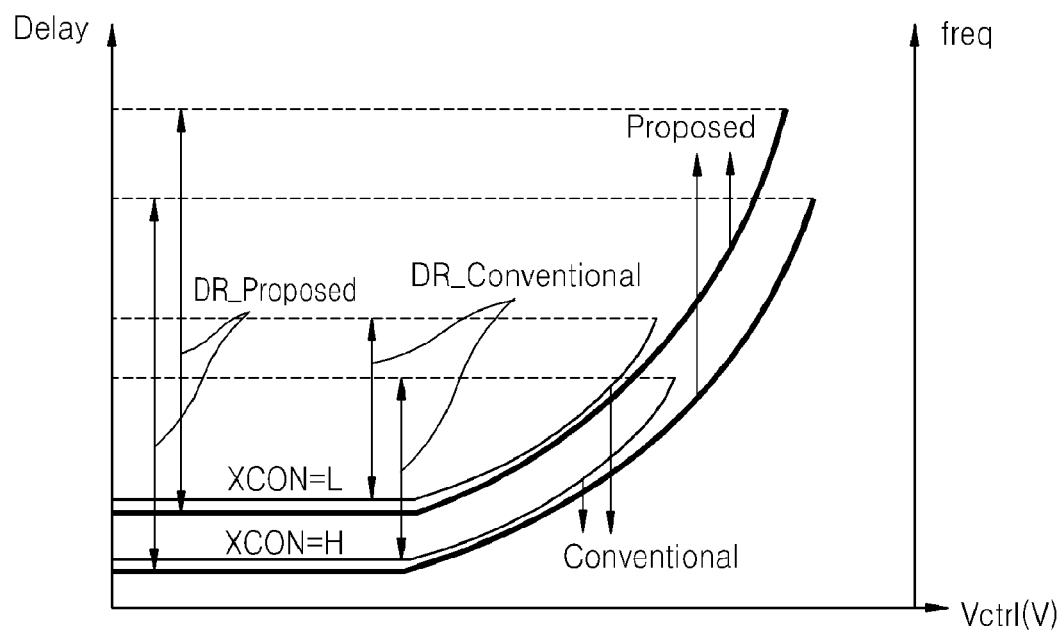
FIG. 23 is a graph showing an increased delay range of the DLL circuit of FIG. 1 or 12.

FIG. 23 is a graph showing an increased delay range of the DLL circuit 100 or 1200. Referring to FIG. 23, the delay range DR_proposed of the DLL circuit 100 or 1200 is increased compared to the delay range DR_conventional of a conventional DLL circuit. Thus, the DLL circuit 100 of FIG. 1 may prevent disappearance of the pulse of the third comparison pulse CCLK[3], as illustrated in FIG. 11, thereby preventing malfunction of the semiconductor device.

Figure 24:
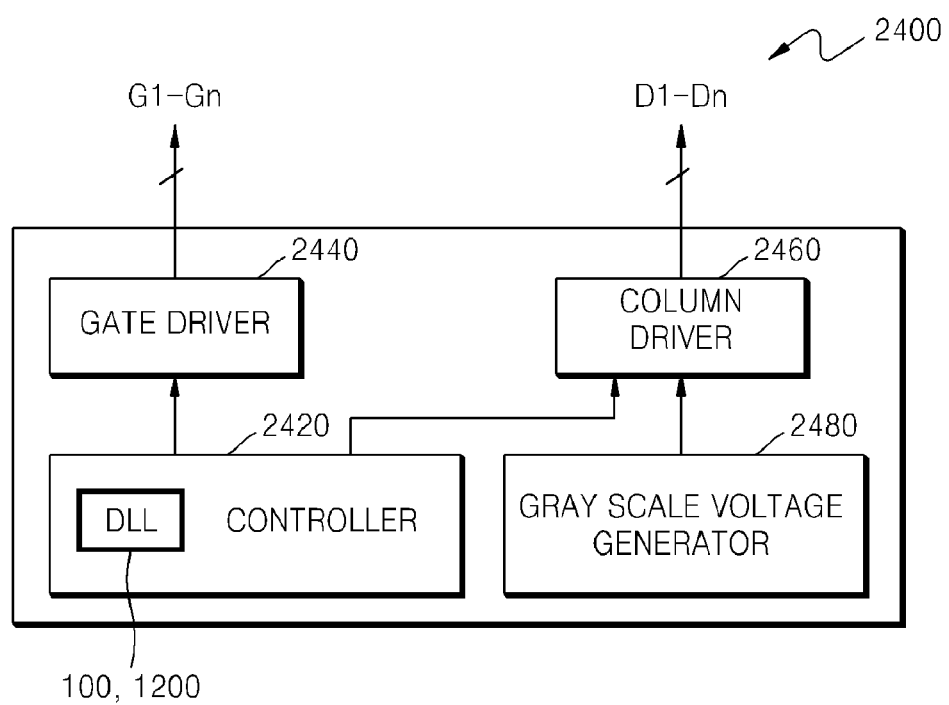
FIG. 24 is a schematic block diagram of a display driver integrated circuit (IC) including the DLL circuit of FIG. 1 or 12, according to an exemplary embodiment.

FIG. 24 is a schematic block diagram of a display driver integrated circuit (IC) 2400 including the DLL circuit 100 or 1200. Referring to FIG. 24, the display driver IC 2400 includes a controller 2420 including the delayed-locked loop circuit 100 or 1200, a gate (G1 to Gn) driver 2440 that receives a control signal from the controller 2420 and activates rows of a display panel (not shown), a column driver 2460 that applies voltage corresponding to the control signal from the controller 2420 and image data to the display panel, and a gray scale voltage generator 2480 that applies a gray scale voltage to the column driver 2460.

The controller 2420 controls the gate driver 2440 and the column driver 2460. The controller 2420 may further include a memory (not shown) that stores the image data received from an external device. The column driver 2460 divides the gray scale voltage to generate a data voltage (voltage applied to the display panel) to be displayed.

The output clocks OUTCLK of the DLL circuit 100 or 1200 may be operating clocks of the controller 2420, the gate driver 2440, and the column driver 2460.

Figure 25:
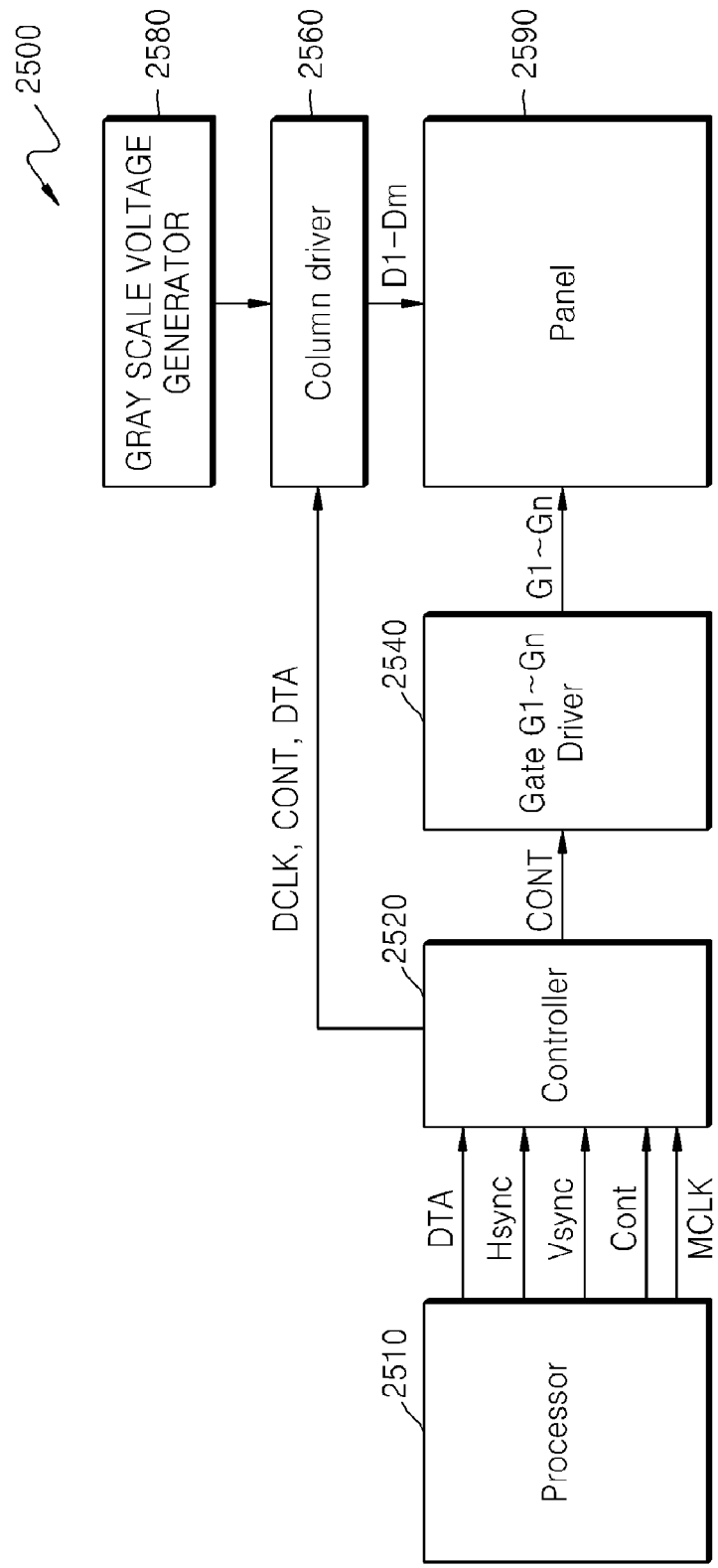
FIG. 25 is a schematic block diagram of a display device including the display driver IC of FIG. 24, according to an exemplary embodiment.

FIG. 25 is a schematic block diagram of a display device 2500 including the display driver IC of FIG. 24. Referring to FIG. 25, the display device 2500 includes a processor 2510, a controller 2520, a gate (G1 to Gn) driver 2540, a column driver 2560, and panel 2590.

The processor 2510 applies image data DTA, a main clock MCLK, a main control signal CONT, a horizontal synchronous signal Hsync, and a vertical synchronous signal Vsync to the controller 2520. The controller 2520 generates a control signal that is used to control the gate driver 2540 and the column driver 2560 by using the image data DTA, the main clock MCLK, the main control signal CONT, the horizontal synchronous signal Hsync, and the vertical synchronous signal Vsync.

A control signal CONT may be a scan start signal that indicates start of an output of a gate on voltage that is used to activate rows of the panel 2590, a gate clock signal that is used to control time at which the output of the gate on voltage starts, an output enable signal that is used to restrict time at which the gate on voltage is sustained, or the like. The scan start signal and the output enable signal may be applied to the gate driver 2540. Also, the control signal CONT may be a horizontal synchronous start signal that indicates start of an input of the image data DTA to columns of the panel 2590, a load signal that indicates applying of voltage corresponding to the columns of the panel 2590 or the like. The horizontal synchronous start signal, the load signal or the like may be applied to the column driver 2560.

While exemplary embodiments have been particularly shown, it will be understood that various changes in form and details may be made therein without departing from the spirit and scope of the following claims.

What is claimed is:
1. A delay-locked loop (DLL) circuit comprising:
a control voltage generator that generates a control voltage corresponding to a delay difference between an input clock and at least two comparison clocks by comparing the input clock with the at least two comparison clocks;

a pulse width adjusting unit that adjusts a pulse width of the input clock according to a delay difference between the input clock and an arbitrary comparison clock of the at least two comparison clocks, and generates a pulse-width adjusted input clock as an adjusted input clock; and a delay unit that delays the adjusted input clock in response to the control voltage and outputs the delayed adjusted input clock as the comparison clocks and output clocks.

2. The DLL circuit of claim 1, wherein the pulse width adjusting unit adjusts the pulse width of the input clock by using the arbitrary comparison clock, wherein the arbitrary comparison clock has been delayed and output by the delay unit, and fed back to the pulse width adjusting unit.

3. The DLL circuit of claim 1, wherein the pulse width adjusting unit generates the pulse-width adjusted input clock to have a pulse width that is greater than the pulse width of the input clock by the delay difference between the input clock and the arbitrary comparison clock.

4. The DLL circuit of claim 3, wherein the pulse width adjusting unit comprises a flipflop that receives the input clock at a clock terminal and receives the arbitrary comparison clock at a reset terminal, wherein the flip-flop generates the adjusted input clock that is activated at a rising edge of the input clock and deactivated at a rising edge of the arbitrary comparison clock.

5. The DLL circuit of claim 1, wherein the pulse width adjusting unit comprises:
an inverter terminal comprising a plurality of inverters connected in series;
a NAND gate that performs a NAND operation on the arbitrary comparison clock and an output signal output from an output of the inverter terminal; and
a set-reset (SR) latch comprising a first end connected to the output of the inverter terminal and a second end connected to the input clock, wherein the SR latch generates the adjusted-input clock that is activated at a rising edge of the input clock and deactivated at a rising edge of the arbitrary comparison clock.

6. The DLL circuit of claim 1, wherein the pulse width adjusting unit comprises:
an inverter terminal comprising a plurality of inverters connected in series;
a NAND gate that performs a NAND operation on the arbitrary comparison clock and an output signal output from an output of the inverter terminal;
an inverter comprising a first end that is connected to the output of the NAND gate, and a second end; and
a set-reset (SR) latch comprising a first end connected to the second end of the inverter and a second end connected to the input clock, wherein the SR latch generates the adjusted-input clock that is activated at a rising edge of the input clock and deactivated at a rising edge of the arbitrary comparison clock.

7. The DLL circuit of claim 1, wherein the arbitrary comparison clock is a comparison clock having a smallest delay among the at least two comparison clocks.

8. The DLL circuit of claim 1, wherein the control voltage generator comprises:
a detector that detects a delay difference between the input clock and the at least two comparison clocks and outputs an up signal and a down signal that correspond to the delay difference between the input clock and the at least two comparison clocks;
a charge pump that charges or discharges electric charges into or from a first node in response to the up signal and the down signal;

a current source generator that supplies current to the charge pump or discharges the current from the charge pump; and
a filter that filters a voltage of the first node to output the filtered voltage as the control voltage.

9. The DLL circuit of claim 8, wherein the detector comprises:
a first detector that performs a coarse lock; and
a second detector that performs a fine lock,
wherein the charge pump comprises:
a first charge pump that discharges or discharges the electric charges into or from the first node in response to a first up signal and a first down signal that are supplied by the first detector; and
a second charge pump that charges or discharges the electric charges into or from the first node in response to a second up signal and a second down signal that are supplied by the second detector.

10. The DLL circuit of claim 8, wherein the current source generator comprises:
a resistor comprising a first end connected to a power supply voltage;
a first PMOS transistor comprising a first end connected to a second end of the resistor;
a first NMOS transistor comprising a first end connected to a second end of the first PMOS transistor, a second end connected to a ground voltage, and a gate connected to the first end of the first NMOS transistor;
a second PMOS transistor comprising a first end connected to the power supply voltage and a second end connected to a gate of the first PMOS transistor;
a second NMOS transistor comprising a first end connected to the second end of the second PMOS transistor, a second end connected to the ground voltage, and a gate connected to the gate of the first NMOS transistor; and
a source transistor having a size that is the same as a size of the second PMOS transistor, connected between the power supply voltage and the ground voltage and comprising a gate connected to the gate of the second PMOS transistor, wherein the source transistor supplies a source current corresponding to current that flows through the second NMOS transistor from the second PMOS transistor to the charge pump.

11. The DLL circuit of claim 1, wherein the delay unit comprises a first delay line comprising a plurality of delayers connected in series and a second delay line comprising a plurality of delayers connected in series; the first and the second delay lines being activated differently in response to the control signal corresponding to an operating speed of a semiconductor device in which the DLL circuit is installed.

12. The DLL circuit of claim 11, wherein a quantity of the plurality of delayers of the first delay line and a quantity of the plurality of delayers of the second delay line are determined according to the number of the comparison clocks and the number of the output clocks, and wherein the plurality of delayers of the first delay line and the plurality of delayers of the second delay line delay the adjusted input clock to generate the comparison clocks and the output clocks.

13. The DLL circuit of claim 12, wherein the plurality of delayers of the first delay line comprise:
a plurality of inverters connected in series;
first transistors comprising a gate connected to the control voltage, a first end connected to the power supply voltage, and a second end connected to a first end of a first inverter of the plurality of inverters; and
second transistors comprising a gate connected to the control voltage, a first end connected to the ground voltage, and a second end connected to a second end of the first inverter of the plurality of inverters;

and wherein the plurality of delayers of the second delay line comprise:

a plurality of inverters connected in series;

first transistors comprising a gate connected to the control voltage, a first end connected to the power supply voltage, and a second end connected to a first end of a first inverter of the plurality of inverters; and second transistors comprising a gate connected to the control voltage, a first end connected to the ground voltage, and a second end connected to a second end of the first inverter of the plurality of inverters.

14. The DLL circuit of claim 13, wherein a quantity of the first transistors and a quantity of the second transistors are each equal to the number of the inverters of the plurality of inverters, and sizes of transistors disposed in the plurality of delayers of the first delay line are different from sizes of transistors disposed in the plurality of delayers of the second delay line.

15. The DLL circuit of claim 13, wherein a quantity of the second transistors is smaller than a quantity of the inverters, and sizes of transistors disposed in the plurality of delayers of the first delay line are equal to sizes of transistors disposed in the plurality of delayers of the second delay line.

16. The DLL circuit of claim 13, wherein a quantity of the second transistors is different than a quantity of the inverters, and sizes of transistors disposed in the plurality of delayers of the first delay line are the same as sizes of transistors disposed in the plurality of delayers of the second delay line, and the number of inverters disposed in the plurality of delayers of the first delay line is different from the number of inverters disposed in the plurality of delayers of the second delay line.

17. The DLL circuit of claim 11, wherein the delay unit further comprises:

a first MUX that selects output clocks generated by one of the first delay line and the second delay line in response to the control signal, and outputs the selected output clocks to an external device; and a second MUX that selects comparison clocks generated by one of the first delay line and the second delay line in response to the control signal, to an external device, supplies the arbitrary comparison clock to the pulse width adjusting unit and supplies the remaining comparison clocks excluding the arbitrary comparison clock to the control voltage generator.

18. The DLL circuit of claim 1, wherein the DLL circuit is installed at a display driver integrated circuit (IC), and the output clocks are operating clocks of the display driver IC.

19. The DLL circuit of claim 1, wherein the at least two comparison clocks are sequentially generated.

20. The DLL circuit of claim 1, wherein the at least two comparison clocks have different delays.

21. The DLL circuit of claim 19, wherein the at least two comparison clocks have different delays.

22. A delay-locked loop (DLL) circuit comprising:

a control voltage generator that generates a control voltage corresponding to a delay difference between an input clock and at least two comparison clocks by comparing the input clock with the at least two comparison clocks; and a delay unit that delays the input clock in response to the control voltage and outputs the delayed input clock as the comparison clocks and output clocks, wherein the delay unit comprises a first delay line and a second delay line, wherein the first delay line comprises a plurality of delayers connected in series and switches a supply current to the plurality of delayers of the first delay line, corresponding to the control voltage and the second delay line comprises a plurality of delayers connected in series and switches the supply current to the plurality of delayers of the second delay line, corresponding to the control voltage.

23. The DLL circuit of claim 22, wherein the plurality of delayers of the first delay line comprise:

a plurality of inverters connected in series;

at least one first current generator that supplies current corresponding to a difference between a power supply voltage and the control voltage, to the plurality of inverters;

at least one first switch connected to the first current generator that turns the first current generator on and off;

and wherein the plurality of delayers of the second delay line comprise:

a plurality of inverters connected in series;

at least one first current generator that supplies current corresponding to a difference between a power supply voltage and the control voltage, to the plurality of inverters;

at least one first switch connected to the first current generator that turns the first current generator on and off.

24. The DLL circuit of claim 23, wherein the first current generator is a PMOS transistor comprising a first end connected to a corresponding inverter among the plurality of inverters, and a gate that is connected to an output of an inverter that receives an output of the corresponding inverter.

25. The DLL circuit of claim 22, wherein the plurality of delayers of the first delay line comprise:

a plurality of inverters connected in series;

at least one second current generator that supplies current corresponding to a difference between a ground voltage and the control voltage, to the plurality of inverters;

at least one second switch connected to the second current generator that turns the second current generator on and off;

and wherein the plurality of delayers of the second delay line comprise:

a plurality of inverters connected in series;

at least one second current generator that supplies current corresponding to a difference between a ground voltage and the control voltage, to the plurality of inverters;

at least one second switch connected to the second current generator that turns the second current generator on and off.

26. The DLL circuit of claim 25, wherein the second current generator is an NMOS transistor comprising a first end connected to a corresponding inverter among the plurality of inverters, and a gate that is connected to an output of an inverter that receives an output of the corresponding inverter.

27. The DLL circuit of claim 22, wherein the at least two comparison clocks are sequentially generated.

28. The DLL circuit of claim 22, wherein the at least two comparison clocks have different delays.

29. The DLL circuit of claim 27, wherein the at least two comparison clocks have different delays.

* * * * *